(12) United States Patent
Quartapella et al.

(10) Patent No.: US 12,399,081 B2
(45) Date of Patent: *Aug. 26, 2025

(54) SMART SEALS FOR MONITORING AND ANALYSIS OF SEAL PROPERTIES USEFUL IN SEMICONDUCTOR VALVES

(71) Applicants: Greene, Tweed Technologies, Inc., Wilmington, DE (US); University of Rhode Island Board of Trustees, Kingston, RI (US)

(72) Inventors: Carmen J. Quartapella, Collegeville, PA (US); Mookkan Periyasamy, Wilmington, DE (US); Elizabeth Sassano, West Chester, PA (US); Otto J. Gregory, Narragansett, RI (US); Godi Fischer, Wakefield, RI (US); Tao Wei, West Kingston, RI (US); Zakary Kinzel, Narragansett, RI (US); Noah A. Burke, Cumberland, RI (US)

(73) Assignees: Greene, Tweed Technologies, Inc., Wilmington, DE (US); University of Rhode Island Board of Trustees, Kingston, RI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/402,623

(22) Filed: Jan. 2, 2024

(65) Prior Publication Data
US 2024/0255378 A1 Aug. 1, 2024

Related U.S. Application Data

(63) Continuation of application No. 16/888,726, filed on May 30, 2020, now Pat. No. 11,860,059.
(Continued)

(51) Int. Cl.
*G01M 13/005* (2019.01)
*G01M 13/003* (2019.01)
*H01J 37/32* (2006.01)

(52) U.S. Cl.
CPC ........ *G01M 13/005* (2013.01); *G01M 13/003* (2019.01); *H01J 37/32513* (2013.01)

(58) Field of Classification Search
CPC .............. G01M 13/005; G01M 13/003; H01J 37/32513
See application file for complete search history.

(56) References Cited

U.S. PATENT DOCUMENTS

| 4,879,901 A | 11/1989 | Leon |
| 5,363,872 A | 11/1994 | Lorimer |

(Continued)

FOREIGN PATENT DOCUMENTS

| CN | 202403708 U | 9/2012 |
| CN | 202416270 U | 9/2012 |

(Continued)

OTHER PUBLICATIONS

International Search Report and Written Opinion from Counterpart International Application No. PCT/US2020/035479, Aug. 24, 2020 (19 pages).

(Continued)

*Primary Examiner* — Manuel L Barbee
(74) *Attorney, Agent, or Firm* — Calderone McKay LLC

(57) ABSTRACT

Methods, systems and a self-sensing valve assembly are described for monitoring seal life. The method includes providing a valve assembly movable from an open position to a closed position and including a seal seated within the valve and in contact with a surface of the valve assembly, wherein when the seal is in operation it is subject to degradation. At least one sensor is placed for measuring (Continued)

micro strain on a surface of the valve assembly or within the valve assembly. The valve assembly is placed in an operation wherein the seal is subject to degradation and the operation of the valve assembly is initiated. At a time after the operation is initiated, micro strain data is recorded and at least one other property related to a condition selected from an ambient condition of operation and a condition related to degradation of the seal is recorded; and the recorded data is analyzed against baseline data associated with 100% seal life to evaluate seal life at the time after the operation is initiated as a percentage of seal life less than 100%.

26 Claims, 21 Drawing Sheets
(4 of 21 Drawing Sheet(s) Filed in Color)

Related U.S. Application Data

(60) Provisional application No. 62/855,639, filed on May 31, 2019.

(56) References Cited

U.S. PATENT DOCUMENTS

| | | | |
|---|---|---|---|
| 5,581,019 | A | 12/1996 | Minor et al. |
| 6,291,814 | B1 | 9/2001 | Chuang et al. |
| 6,378,378 | B1 | 4/2002 | Fisher |
| 6,520,507 | B2 | 2/2003 | Pataille et al. |
| 6,553,280 | B2 | 4/2003 | Johnson et al. |
| 6,561,518 | B1 | 5/2003 | Lutaud |
| 6,575,186 | B2 | 6/2003 | Maung |
| 6,776,567 | B2 | 8/2004 | Johnson et al. |
| 7,073,794 | B2 | 7/2006 | Bock et al. |
| 7,086,275 | B2 | 8/2006 | Bock et al. |
| 7,265,537 | B2 | 9/2007 | Lutaud et al. |
| 7,289,863 | B2 | 10/2007 | Arruda et al. |
| 7,301,223 | B2 | 11/2007 | Rodney et al. |
| 7,398,692 | B2 | 7/2008 | Hiroki et al. |
| 7,658,200 | B2 | 2/2010 | Choi et al. |
| 7,665,355 | B2 | 2/2010 | Zhang et al. |
| 7,712,527 | B2 | 5/2010 | Roddy |
| 7,838,912 | B2 | 11/2010 | Niwa et al. |
| 7,841,582 | B2 | 11/2010 | Bang et al. |
| 8,064,070 | B2 | 11/2011 | Schauer |
| 8,083,949 | B2 | 12/2011 | Lewis et al. |
| 8,132,782 | B2 | 3/2012 | Duelli et al. |
| 8,162,050 | B2 | 4/2012 | Roddy et al. |
| 8,282,013 | B2 | 10/2012 | Stewart et al. |
| 8,342,242 | B2 | 1/2013 | Roddy et al. |
| 8,815,616 | B2 | 8/2014 | Bang et al. |
| 9,194,207 | B2 | 11/2015 | Roddy et al. |
| 9,200,500 | B2 | 12/2015 | Roddy et al. |
| 9,347,495 | B2 | 5/2016 | Ito |
| 9,732,584 | B2 | 8/2017 | Roddy et al. |
| 9,899,228 | B2 | 2/2018 | Stevenson et al. |
| 9,975,758 | B2 | 5/2018 | Tedeschi et al. |
| 10,570,689 | B2 | 2/2020 | Jaffrey |
| 11,860,059 | B2 * | 1/2024 | Quartapella ........ G01M 13/005 |
| 2005/0269334 | A1 | 12/2005 | Bang et al. |
| 2009/0045371 | A1 | 2/2009 | Kamibayashiyama |
| 2009/0197015 | A1 | 8/2009 | Kudela et al. |
| 2009/0230342 | A1 | 9/2009 | Komoto et al. |
| 2012/0259559 | A1 | 10/2012 | Jeeves et al. |
| 2014/0106478 | A1 | 4/2014 | Bang et al. |
| 2014/0182381 | A1 * | 7/2014 | Comeaux ............ F16K 37/0075 73/587 |
| 2017/0130562 | A1 | 5/2017 | Jaffrey et al. |
| 2018/0010449 | A1 | 1/2018 | Roberson et al. |
| 2018/0052104 | A1 | 2/2018 | Larsson et al. |
| 2018/0259075 | A1 | 9/2018 | Hofer et al. |
| 2020/0056722 | A1 | 2/2020 | Eschenmoser et al. |
| 2020/0157907 | A1 | 5/2020 | Jaffrey |
| 2020/0166154 | A1 | 5/2020 | Eschenmoser et al. |
| 2020/0182377 | A1 | 6/2020 | Brown et al. |
| 2020/0224788 | A1 | 7/2020 | Eschenmoser et al. |
| 2020/0224790 | A1 | 7/2020 | Eschenmoser et al. |

FOREIGN PATENT DOCUMENTS

| | | |
|---|---|---|
| CN | 102207415 B | 8/2014 |
| DE | 102006001131 A1 | 8/2006 |
| EP | 3 392 541 A1 | 10/2018 |
| JP | 09243488 A | 9/1997 |
| JP | 2007100848 A | 4/2007 |
| JP | 2009218477 A | 9/2009 |
| JP | 2017027118 A | 2/2017 |
| KR | 101132261 B1 | 4/2012 |
| TW | M295740 U | 8/2006 |
| WO | WO 2011/120385 A1 | 10/2011 |
| WO | WO 2020243685 A1 | 12/2020 |

OTHER PUBLICATIONS

Extended European Search Report for Counterpart U.S. Appl. No. 20/815,646, filed May 31, 2023, (7 pages).
Response to Extended European Search Report from Counterpart 2085643.3 Dec. 29, 2023 (15 pages).
European Examination Report from Counterpart 2085643.3, Mar. 7, 2025 (5 pages).
Strain Gage Rosettes: Selection, Application and Data Reduction, Micro-Measurements, Vishay Precision Group, 12 pages.
Taiwanese Office Action (with Translation) for Counterpart Application No. 109118343, Feb. 6, 2024 (35 pages).
Taiwanese Response for Counterpart Application No. 10918343, Aug. 6, 2024 (with English claims).
Taiwanese Notice of Allowance for Counterpart Application No. 10918343, Nov. 7, 2024 (with English translation).
First Japanese Office Action (with Translation) for Counterpart Application No. 2021-571304, Jan. 4, 2024, (11 pages).
Response to Japanese Office Action for Counterpart Appln. No. 2021-571304, with English Claims Jul. 4, 2024 (21 pages).
Japanese Official Action (with Translation) for Application No. 2021-571304, Oct. 4, 2024, (4 pages).
First Korean Office Action (with translation) for Application No. 1020217043101, Jul. 25, 2024, (24 pages).
Singapore Search Report and Written Opinion, Feb. 10, 2025, 11 pages.

* cited by examiner

SMART SEALS FOR MONITORING AND ANALYSIS OF SEAL PROPERTIES USEFUL IN SEMICONDUCTOR VALVES

CROSS-REFERENCE TO RELATED APPLICATIONS

This U.S. non-provisional patent application claims the benefit under 35 U.S.C. § 119(e) to U.S. provisional patent application No. 62/855,639, filed May 31, 2019, entitled, "Smart Seals for Monitoring and Analysis of Seal Properties Useful in Semiconductor Slit and Gate Valves," the entire disclosure of which is incorporated herein by reference.

BACKGROUND OF THE INVENTION

Field of the Invention

This invention relates to the field of seals that are capable of being self-sensing seals, particularly seals that provide the ability for monitoring and analysis of seal property and seal life data.

Description of Related Art

Various valve assemblies for use in semiconductor manufacturing, including slit valve and gate valve doors and others are well known. With respect to slit valve and gate valve doors, such doors close against semiconductor manufacturing equipment with a seal or gasket to ensure that contaminants remain outside the reaction chamber and that reactants from within the chamber do not escape the chamber. However, such reaction chambers need to open and close during manufacture to allow wafers for manufacturing chips and similar target substrates to move into and out of a reaction chamber. In one preferred design, the seal for such slit and gate valves is incorporated in a bonded assembly referred to as a bonded gate valve or a bonded slit valve ("BSV").

For purposes of illustration, we will refer generally to such doors as slit valves or BSVs. Slit valve doors used, e.g., in semiconductor etching and deposition systems, provide needed sealing properties but can be variably impacted by different reactants and different reactant conditions. Such slit valves, incorporating a door and seal, operate on a valve that actuates so as to open and close the door over the "slit" opening into the chamber. The seal is provided so as to seal around the opening or slit in the chamber and seal the chamber opening when the valve is in the closed position. When the valve is open, substrates for semiconductor manufacture are moved in and out of the process chamber through the slit.

Harsh precursors, plasmas, high-temperature and other conditions can cause different types of seals to wear at variable rates. A majority of such reaction chambers operate under vacuum conditions and use seals throughout the system to maintain the vacuum environment.

As such seals are formed generally of highly chemically resistant elastomeric materials, they are themselves costly to purchase, so it is understandable that one may not want to change out the seal precipitously. However, due to the variability in the impact of reactants and conditions on various elastomeric materials used to make the seals, it is not always easy to predict when the level of sealing begins to be compromised and/or when an unanticipated failure is imminent. Elastomeric sealing properties as well as other physical properties of the materials can be tested to estimate failures in different environments and that information used to provide expected seal life information. However, with varying environments, conditions and use expectations, to be safe, one would expect to change out the seal before harm, inconsistency in product outcome or failure to a particular product occurs.

As the products made are themselves very costly to manufacture, unnecessary maintenance down time and/or failure are even more costly to a manufacturer than replacement of a seal. Thus, effective seal life is a key factor that impacts chamber up-time, use of the chamber, maintenance scheduling and product failures due to seal material degradation. The chemical, temperature and other process conditions impact the material of the seal and door and mechanical stresses occur due to valve actuation, all of which can lead to seal degradation and failure.

One way of addressing such issues in the prior art involved use of expected seal life and testing, which can incur additional costs as noted above. Monitors are also sometimes positioned within reaction chambers which are monitored for changing conditions within the chamber that could impact manufacture. Reactants are also monitored. Degradation is typically realized by detecting a vacuum leak or the presence of particle generation from the degrading seal material.

However, such problems could be ameliorated, cost savings achieved and failures minimized if there were a successful way to know when a seal was compromised and/or impacting the process requiring maintenance. Further, operations could be improved if there were a way to maximize seal life while avoiding the disadvantages of seal degradation as noted above.

In certain other environments where conditions are harsh, such as in downhole applications in the oilfield area, certain developments in seal monitoring have been developed to create seals that provide feedback. For example, U.S. Patent Publication No. 2017/0130562 A1 teaches embodiments of seals for oilfield applications, both in wells and in other components in well head assemblies that embed sensors in a seal to acquire data that can be used to determine and monitor the condition of seals by monitoring physical operating conditions and the stress or strain on the seal. This data is used to determine when the seal will need to be replaced on a scheduled basis regardless of its condition. Data gathered is compared to base-line data using a data analyzer and predictive algorithms to evaluate expected performance characteristics of seals. Antennae and RFID tags or wear sensors may also be incorporated. Sensors may also be embedded in packing.

Other prior art attempts to monitor aspects of seal life, or to employ sensors and other detectors in semiconductor processing steps include, e.g., placing sensors on slit valves and sealing plates to monitor an aspect of the process, but such attempts generally do not focus on deterioration of the seal, but more typically focus on the door function, door pressure or avoidance of damage to process substrates moving in and out of the door so as to ensure their proper transport and positioning within the chamber. Such patents insert or incorporate sensors in or on the seal or separated between chambers and/or inside and outside a chamber or door for monitoring pressure differentials.

Examples of such types of sensor use include the following.

U.S. Pat. No. 7,841,582 B2 describes a method and apparatus for controlling pressure on a slit valve door using an actuator to apply a different pressure to the actuator and door during cleaning as opposed to during a reaction where the internal pressure will be higher than during cleaning so that the seal is not unnecessarily under high vacuum conditions during cleaning.

U.S. Pat. No. 8,815,616 describes a slit valve unit with a housing around the slit valve and a series of packing units (O-ring seals) to make the area airtight. A small conduit communicates with the airtight area between the seals and with a sensor unit that can monitor pressure change to avoid explosion or leakage of process gas and a control unit that can shut the unit down to prevent an event.

U.S. Pat. No. 9,347,495 includes a bearing assembly formed using an RFID that has an inlet IC chip, an antenna connected to that chip and a magnetic sheet function embedded in either the bearing seal or the raceway ring.

U.S. Pat. No. 8,282,013 describes embedded RFID transponders that are centered within a seal and then vulcanized. The seals are described as thus being able to communicate through the RFID transducer which may be programmed to include information about the seal (part number, serial, batch and/or lot number, code, dimensions, date of manufacture or sale, installation and/or expiration date).

U.S. Pat. No. 7,398,692 is directed to a circuit chip attached in a united manner to an O-ring seal that has an information-transmitting means to transmit information outside the sealing ring. The chip is sandwiched in a cut in the seal body and then the cut was fixed. Wiring attached to the sensor is pulled out of the main body part and connected to a pressure measuring apparatus. The pressure monitoring is evaluated to measure internal seal stress and pull the seal from service when it reduces inner stress to 80%.

U.S. Patent Publication No. 2018/0052104 A1 describes use of a part wear indicator material that may be placed in various locations of a chamber. The wear indicator has different layers and a phosphorescent material to indicate wear.

U.S. Pat. No. 9,975,758 includes micro sensors which may be mounted on wafer processing equipment to monitor various conditions in real time. The microsensors may also be placed throughout the process chamber as well as on the tools.

U.S. Pat. No. 7,658,200 B2 discloses use of a pressure regulation system for two chambers separated by a slit valve. The purpose is to monitor the pressure differential in the chamber to avoid inadvertently opening the chamber. The patent teaches use of a pressure sensor in each chamber that communicates with a controller to prevent inadvertent opening. The sensors are not being used to monitor conditions that impact seal effectiveness.

U.S. Pat. No. 6,575,186 uses a series of sensors on a bonded slit valve door to control the speed of the pneumatic pressure on the door in order to give the door a softer landing during the closing process and avoid seal damage. The three sensors used are for positioning and interaction with the pneumatic closing system.

U.S. Pat. No. 6,291,814 places sensors at either end of a slit valve with emitters and receivers of signals that monitor movement near the door to avoid the door damaging a moving wafer on the seal plate.

U.S. Pat. No. 5,363,872 describes control of a slit valve door based on a pressure differential over a barrier (described as a wall) between an entry chamber and reaction chamber. Each chamber has a sensor, and the pressure differential is analyzed to control operation of the door and the pressure applied by the slit valve door.

The applicant herein has contributed to development of products for monitoring properties in a reaction chamber, having previously developed a camera known as the "Wafer Cam" that allowed camera sensing of the interior of a process chamber, however, such camera was not developed for the operation of monitoring the health of seals in BSVs or other semiconductor valve assemblies.

There remains a need in the art for improved ways to ensure maximum useful seal life and critical analysis that would assist in choosing the optimal seal and associated maximum seal life for use in semiconductor processing so as to minimize down time and up time, improve maintenance cycles and avoid seal degradation failures.

BRIEF SUMMARY OF THE INVENTION

The invention herein includes embodiments of a method for monitoring seal life comprising: providing a valve assembly movable from an open position to a closed position and a seal seated within the valve and in contact with a surface of the valve assembly, wherein when the seal is in operation it is subject to degradation; placing at least one sensor for measuring micro strain on a surface of the valve assembly or within the valve assembly; placing the valve assembly in an operation wherein the seal is subject to degradation and initiating the operation of the valve assembly; at a time after the operation is initiated, recording micro strain data and at least one other property related to a condition selected from an ambient condition of operation and a condition related to degradation of the seal; and analyzing the recorded data against baseline data associated with 100% seal life to evaluate seal life at the time after the operation is initiated as a percentage of seal life less than 100%.

The seal preferably has elastomeric properties. The valve assembly may be one of a valve assembly with a door, a pendulum valve assembly, and an isolation valve assembly or other similar valve assemblies. In one embodiment the valve assembly is a valve assembly with a door and the door is configured for covering an opening in a process chamber, and the valve assembly further comprises a valve for operating the door from the open position to the closed position and the seal contacts the door.

In a further embodiment the method further comprises placing the at least one sensor on an exterior surface of the door for measuring micro strain. In the method operation of the valve assembly may be initiated by initiating a vacuum process when the door is in the closed position. The method may further comprise evaluating the seal life at the time after the vacuum process is initiated as a percentage of seal life less than 100%. In such embodiments, the movable valve door may be a bonded slit valve or gate valve. The seal may be mechanically affixed to a surface of the door, and the seal preferably has elastomeric properties.

There may further be two or more sensors for measuring micro strain that are each positioned at different locations on the door. Such sensors may be bonded to the exterior surface of the door. Further, one or more strain gage rosette pattern(s) may be positioned on the door. In the case of use of two or more strain gage rosette patterns, they are preferably positioned in different locations on the door.

In one embodiment of the method using a valve with a door, the baseline data is measured after calibrating the door. The baseline data may also be measured when a load is applied to the door and then removed, based at least in part on initial micro strain data. In such an embodiment, the baseline data may be created by measuring initial micro strain data at 100% seal life and again at one or more percentages of seal life to create an adjusted range of baseline data. The baseline data may be saved and incorporated into a database for predicting seal life for a type of door and seal in a specific process.

In a further embodiment of the method herein, the at least one sensor may be a strain gage. Further, the at least one other property is related to an ambient condition of operation and is selected from one or more of temperature, humidity, and vibration, and monitoring of such condition of operation is used to compensate for ambient noise. At least one sensor is preferably placed to measure each of the at least one other property.

The strain gage micro strain data is preferably converted to a digital signal through use of a circuit including a Wheatstone bridge to convert micro strain to data to a change in voltage, and the method also comprises conditioning an analog signal from the measured change in voltage, and converting the analog signal to the digital signal. In such a method, the circuit is incorporated into a printed circuit board. The Wheatstone bridge preferably incorporates high precision resistors having a tolerance of no greater than about 0.25%, and preferably a tolerance no greater than of about 0.1%. The circuit may comprise an amplifier.

In a further embodiment, the baseline data is measured after calibrating the valve assembly. The baseline data is preferably measured after the valve assembly is in operation and the valve is under pressure, based in part on initial micro strain data. The baseline data may also be measured when a load is applied to the valve and then removed, based at least in part on initial micro strain data. The baseline data may be created by measuring initial micro strain data at 100% seal life and again at one or more percentages of seal life to create an adjusted range of baseline data. In embodiments using a valve assembly with a door, the baseline data may be saved and incorporated into a database for predicting seal life for a type of door and seal in a specific process.

The invention further includes a system for analyzing seal life, comprising: at least one memory for storing computer-executable instructions; and at least one processing unit for executing the instructions stored in the memory, wherein execution of the instructions programs the at least one processing unit to perform operations comprising: engaging a valve assembly movable from an open position to a closed position, to place the valve assembly in operation, wherein the valve assembly comprises a seal and the seal is seated within the valve and in contact with a surface of the valve assembly, and wherein pressure is applied to the valve assembly in operation and the seal is subject to degradation; receiving from a circuit a signal from a change in voltage, wherein the circuit is in communication with at least one sensor for measuring micro strain on a surface of the valve assembly or within the valve assembly; recording micro strain data and at least one other property related to a condition selected from an ambient condition of operation and a condition related to degradation of the seal after operation of the valve assembly is initiated; and analyzing the recorded data against baseline data associated with 100% seal life to evaluate seal life at the time after the operation of the valve assembly is initiated as a percentage of seal life less than 100%.

In one embodiment of the system the seal has elastomeric properties. The valve assembly may be one of a valve assembly with a door, a pendulum valve assembly, and an isolation valve assembly. The valve assembly may be a valve assembly with a door and the door is configured for covering an opening in a process chamber, and the valve assembly further comprises a valve for operating the door from the open position to the closed position and the seal contacts the door. The system may further comprise at least one sensor placed on a n exterior surface of the door for measuring micro strain. The operation of the valve assembly may be initiated by initiating a vacuum process when the door is in the closed position. In the system, the seal life may be evaluated at the time after the vacuum process is initiated as a percentage of seal life less than 100%. The movable valve door may be a bonded slit valve or gate valve.

The invention further includes a self-sensing valve assembly, comprising: a valve assembly movable from an open position to a closed position, comprising a seal which is seated within the valve assembly and is in contact with a surface of the valve assembly, wherein in operation of the valve assembly, the seal is under pressure and is subject to degradation; and at least one sensor for measuring micro strain on a surface of the valve assembly or within the valve assembly and at least one sensor for measuring at least one other property related to a condition selected from an ambient condition of operation and a condition related to degradation of the seal in operation, wherein the sensor is in communication with a circuit capable of sending a signal from a change in voltage.

In one embodiment, the self-sensing valve assembly further comprises a thermocouple in communication with one of the sensors measuring micro strain on the exterior surface of the valve assembly. The seal preferably has elastomeric properties. The valve assembly may be one of a valve assembly with a door, a pendulum valve assembly, and an isolation valve assembly. Preferably, the valve assembly is the valve assembly with a door and the door is configured for covering an opening in a process chamber, and the valve assembly further comprises a valve for operating the door from the open position to the closed position and the seal contacts the door. The at least one sensor is preferably placed on a surface of the door for measuring micro strain. Operation of the valve assembly may be initiated by initiating a vacuum process when the door is in the closed position. In such an embodiment, the seal life may be evaluated at the time after the vacuum process is initiated as a percentage of seal life less than 100%. The movable valve door is preferably a bonded slit valve or gate valve.

The system and self-sensing valve assemblies herein may further incorporate any of the other variations of the method as described above and elsewhere herein.

BRIEF DESCRIPTION OF THE SEVERAL VIEWS OF THE DRAWING(S)

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. At least one drawing executed in color is included herein. Copies of this patent or patent application publication with color drawings will be provided by the Office upon request and payment of the necessary fee. In the drawings:

DETAILED DESCRIPTION OF THE INVENTION

Figure 1:
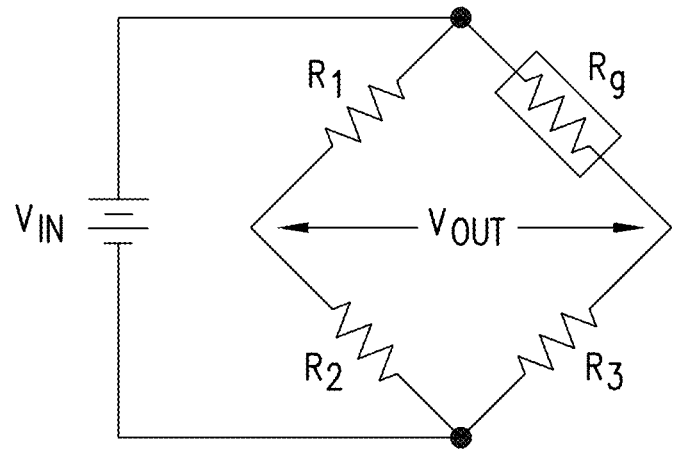
FIG. 1 is an example diagram of a Wheatstone Bridge for use in an embodiment of the invention herein.

As used herein, words like "inner" and "outer," "upper" and lower," "proximal" and "distal," "top" and "bottom," and words of similar import are used herein to aid a reader of the disclosure in better comprehension of the invention in view of the drawings herein, and while intending to be helpful to the reader are not meant to be limited in any manner.

Applicants have developed self-sensing seals for use in semiconductor valve assemblies having seals, such as slit valve doors with seals, e.g., BSVs, pendulum valves and other chamber or flow isolation valves, and related systems and methods that are able to provide real-time status of the useable seal life for use in such valve assemblies, such as seals used in the door of a BSV. The system is able to detect multiple properties and phenomena that can impact seal life, including changes in pressure applied to the seal, temperature at the interface of the door or other valve assembly surface and seal, process intensity at the door or other assembly surface interface, chemical and pathway exposure of the seal to a semiconductor or other harsh chemical process, and other properties. The system may also optionally include a visual camera interface. The detected information is then received in the system and used to estimate relative seal life in view of the actual variables then impacting the particular valve assembly or door in a BSV in that process. Thus, each seal in use can be optimized for its best seal life. In addition, a user of the system can monitor seal health while the seal is in use to estimate that seal's expected life and avoid door seal and other valve seal failures that can lead to lost product.

While the self-sensing seals, and methods and systems herein for monitoring seal-life herein are particularly useful in semiconductor manufacturing valve assemblies including BSVs, they may also be employed in similar valves that are used in fluid handling and in other environments in which a seal's life is important to operation and in which the seals are in an environment under pressure, strain and environmental or ambient operating conditions wherein the seal is subject to degradation. This is a particularly difficult issue in the semiconductor manufacturing, and with a particular focus on semiconductor seal assemblies, such as BSVs, pendulum valves and isolation valves. For the purpose of explaining the use of such self-sensing door seals, and other valve assemblies and the related methods and systems herein, the applicant will illustrate the invention through a preferred embodiment of a self-sensing BSV seal, but it will be understood, based on this disclosure, that the embodiment described can be employed for use in other similar valve sealing assemblies.

Gate and slit valves having seals are known in the art, and the method and system can be implemented using any of these designs. Examples of commercially acceptable doors of this nature are available from Greene, Tweed & Co. of Kulpsville, Pennsylvania, USA, and are also described, for example, in U.S. Patent Application Publication No. 2012/0100379A1, incorporated by reference in relevant part.

Other BSVs and gate valves with bonded or other assemblies with seals that are known or to be developed can be used in the system and method herein.

Such gate and slit valves are generally formed of a metallic door material (metal or metal alloy), with preferred materials including aluminum or stainless steel. The seals in such doors are preferably formed of elastomeric material or material that has elastomeric properties under the operating conditions. Typical materials used are fluoroelastomer, perfluoroelastomers, silicon-based elastomers or polyarylene materials that have elastomeric properties. In addition, backup rings or seals may also be incorporated such as fluoropolymers (like polytetrafluoroethylene) alone or as a backup protection seal for primary seals formed with elastomeric or materials with elastomeric properties.

Such seals may be mechanically affixed, bonded, or molded in place on the door, with a variety of materials and door assemblies available commercially.

As there are various conditions impacting seal life and a BSV, applicant evaluated those conditions and properties impacted by temperature (such as thermal expansion, stress relaxation, and compression set of the seal), pressure (such as vacuum level and force on the seal, actuator force (i.e., the force needed by the actuator based on the state of the seal), and the effects of chemical erosion on the sealing material and door (which are impacted by plasma etching, the level of erosion and micro strain). Based on such evaluation, applicant developed a monitoring system to measure these properties and provide real-time feedback to a learning system while a BSV is in service, which system uses relevant algorithms developed to evaluate the properties against seal-life in a learning database so as to control and evaluate seal life while in use to maximize seal life and predict failure and maintenance.

In one embodiment, micro strain on the back of the BSV door was demonstrated to contribute to reaction pressure on the back of the plate of the door and can be used as a property that is monitored in the method herein. The bow or strain to the door material which is typically a metal provides minor strain changes in the door, which strain data is used to monitor the seal. The seal in this instance is located on the door itself or milled into the door and the BSV would include a strain gauge (also identified as a strain gage).

In another embodiment, a linear variable differential transformer (LVDT), which is an electromechanical sensor used to convert mechanical motion or vibrations, specifically rectilinear motion, into a variable electrical current, voltage or electric signals, and the reverse, can be employed and placed proximate to the seal to measure distance in the gap between the door and the mating surface internally. The distance is then translated into the method of monitoring seal deterioration. Suitable commercial LVDTs that may be employed are available, for example from Omega Engineering, Inc. of Norwalk, Connecticut, USA.

In a further embodiment of the method a capacitive sensor may be used on the door to measure capacitance between the door and mating surface which varies with distance using a proximity switch.

Such sensors of varying types may be placed on varying locations of a valve assembly, for example, on a BSV, the sensors may be placed anywhere on the exterior surface of the valve assembly, whether facing towards a reaction chamber (inner side of the door) or outside the chamber (outer side of the door or on another component of the valve assembly) or on the edges/sides of the door or assembly, and also may be placed within the door or another component part of the assembly (such as by machining or otherwise forming a location within the door for receiving a sensor). It is within the scope of the invention also that sensors may also be placed on, near or in the seal itself, however, in preferred embodiments, the sensors are not employed in a manner to harm or interfere with operation of the seal.

In preferred embodiments herein, multiple sensors, such as strain gages were found to function with the stronger resolution when placed closer to the seal, and may even be placed on or in the seal without departing from the scope of the invention. To avoid impact of seal function, however, one of skill in the art, would understand, based on this disclosure, that in preferred embodiments to generate good resolution and not unnecessarily impact the seal function, placement is indicated which is close to the seal in a proximity that allows for sufficient repeatability, sensor data collection and resolution.

The above-noted properties and others as well may be measured in the method herein for evaluating seal life. The methods herein can monitor BSVs and other similar scaling door life and use in real-time, and data may be incorporated in a learning database in which data may also be collected based on variable seal cross-sectional profiles. As not all seal profiles are the same in cross-section, the seal life data may also be used to evaluate the best seal profile in a given end application for the same or different sealing materials. This data can provide a basis for significant insight into how a particular seal design should behave in a given environment over the course of its measurable life from new (as a baseline) and over time.

Based on such measurements, the method herein was devised to detect seal degradation by measuring, at least, strain on the BSV door using strain gages to detect the change in O-ring degradation to measure seal wear. Such measurements relate the strain data to seal wear during operation over millions of cycles of loading and unloading for long-term sensing. The micro strain/micro stress data, as well as data concerning stress relaxation, vacuum force pressure on the door and temperature, for given seal cross-sectional geometries are preferably measured throughout the process for evaluating seal-life.

Based on strain gage testing it was determined that strain gages may be used in one or more locations on the BSV door plate, preferably located on the face or side of the BSV door to provide preferred resolution, but the locations and number of strain gages used are not limited as strain gage placement can be varied if desired. Preferably at least about 2 strain gages are used. In some embodiment no greater than about 10 gages are used. However, no specific number is required and more than 10 can be employed as well. It is preferred that the strain gages are placed in different locations of the exterior surface of the door or on the exterior surface of another components of the valve assembly whether on a surface where the seal is placed so as to contact a degradation source such as manufacturing plasma and chemicals (inner side of the door) or on the opposite surface of the door (outer side of the degradation source) or on another surface of the door or valve assembly (such as a side or edge of a door, on, near or in the seal) or within one of the valve assembly components if made so as to allow for seating of a sensor. In preferred embodiments described herein, the sensors are varied with some on the inner, outer and edge/side portions of the overall exterior door surface.

In one preferred embodiment the strain gages may be employed in one or more strain gage rosette(s), in which two or more closely positioned gage grids, which are individually oriented so as to measure strain in different directions are positioned. Such rosettes are useful for obtaining independent strain measurements due to the direction placement to facilitate determination of principal strains and stresses. Strain gage rosettes come in varying forms including two mutually perpendicular grids, rectangular rosettes with three grids, two of which are angled from the first grid, respectively by 45 and 90 degrees, and a more triangular arrangement with three grids, where two are angled respectively to the first at 60 and 120 degrees. See, Vishay Precision Group, Strain Gages and Instruments, Tech Note TN-515. Suitable strain gages may be purchased from Vishay Precision Group, Raleigh, North Carolina, USA. If more than one rosette is used, it is preferred that they be in different locations on the door or other valve assembly exterior surfaces (including portions of the exterior surface that may be inner, outer or side surfaces which may or may not be a surface where the seal is in contact with a source of degradation).

Similarly, other sensors may be employed to monitor pressure, temperature and other monitoring process conditions are also be positioned within the system at varying locations on the valve assembly, including near, on or in the seal, or on the exterior surface of a component part (including within the component seated therein). For example, thermocouples may also be used alone or in communication with at least one of the strain gages for monitoring the impact of ambient operation temperature conditions on micro strain.

Other sensor types that can be used to measure various sealing properties and conditions for evaluating seal life include but are not limited to strain gages as noted above, LVDTs, capacitive sensors, piezoelectric sensors, and temperature and pressure sensors.

The measurement of micro strain is preferably converted to a digital signal for evaluating data by various methods known or to be developed in the art. In one embodiment, herein the sensors incorporate a circuit including a Wheatstone bridge. Using a Wheatstone Bridge Circuit, an example of which is shown in FIG. 1, the resistance, $R_1$, $R_2$ and $R_3$ are the same and equal to R' and Rg is set differently such that Rg=R'+$\Delta$R, and $\Delta$R=2*$\varepsilon$*R, then a voltage applied across the circuit can be measured. For example, the voltage $|V_O|$ can be expressed as in equation (I):

$$|V_o| = V_{in}/2 * \varepsilon/(1+\varepsilon), \tag{I}$$

and can be variable for the applied voltage to convert changing micro strain data into a difference or change in voltage.

Figure 2:
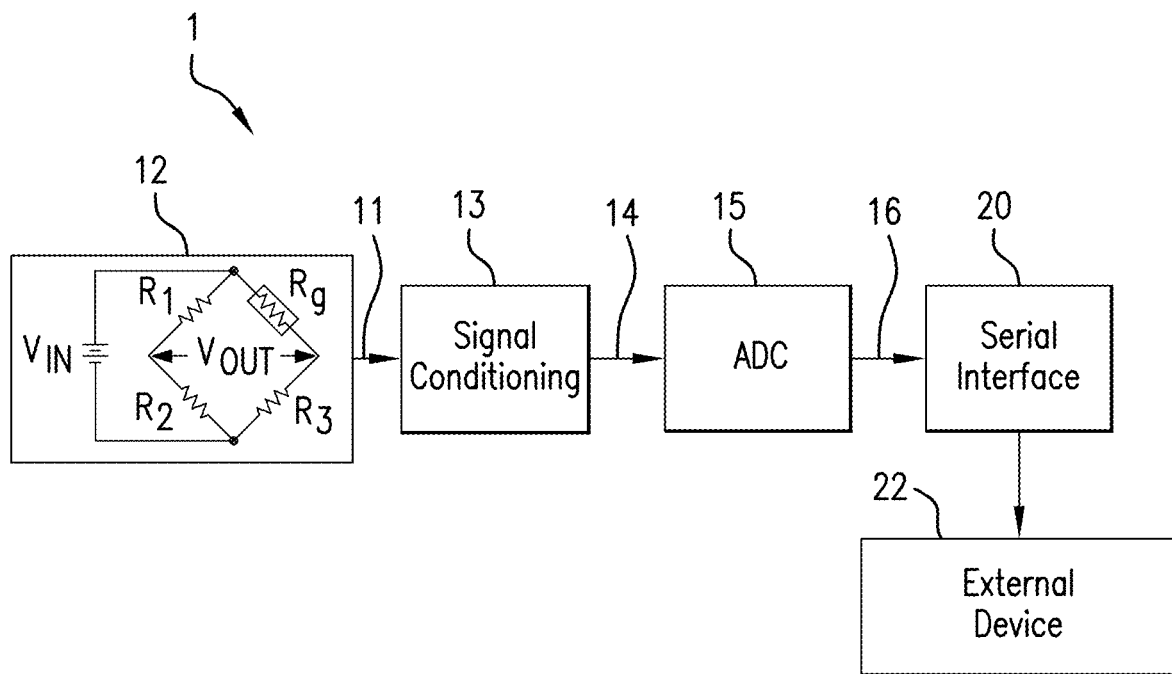
FIG. 2 is a flow diagram of an overall signal conversion process for use in an embodiment of the invention.

As shown in FIG. 2, in overall signal conversion process 1, the signal 11 calculated from the Wheatstone Bridge 12 undergoes signal conditioning 13 using any suitable signal conditioning steps known or to be developed in the art to provide a conditioned analog signal 14, and then is sent to an analog-to-digital convertor (ADC) 15. The analog signal 14 once converted to a digital signal 16 is sent to an external device 22 using a serial interface 20. As some noise may occur in frequencies that are not of interest, this impact is preferably minimized by applying frequency selective components to remove unwanted frequencies, e.g., using a digital clock in the ADC that runs at 64 kHz. In one embodiment, an aliasing filter can be employed to remove signal components at these frequencies from the input signal.

As the target signals are very small, it is preferred that a high-resolution converter be employed, and that amplification is applied before conversion in order to increase the ratio between signal and noise. In preferred, that an amplifier be employed for this purpose. Such amplifiers can be added to the instrumentation or an integrated circuit used which has such an amplifier already incorporated therein.

A serial interface, or Serial Peripheral Interface (SPI) is preferably employed to provide the ability to retrieve data from the ADC and to configure the data to required specifications.

Figure 3:
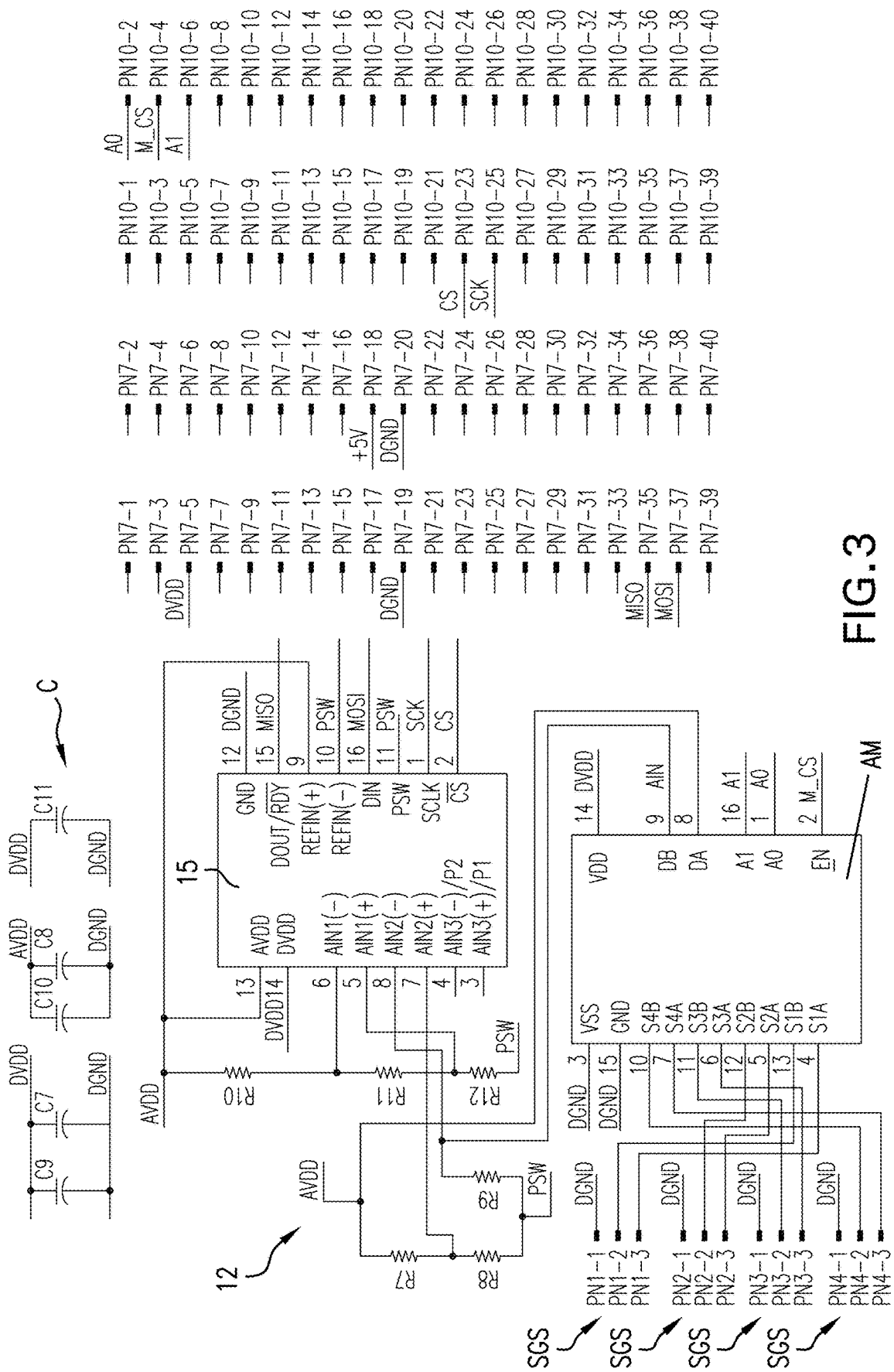
FIG. 3 is a circuit diagram of one example of a circuit for use in the present invention which may be incorporated into a PCB.

The circuit for the system was designed so as to include functional components of the circuit as well as passive elements on a printed circuit board as shown in FIG. 3. FIG. 3 provides one example of a potential circuit diagram that can be used. One skilled in the art would understand, based on the disclosure, that other varying circuit elements may be used or presented to carry out the steps as described herein.

The PCB is preferably designed to minimize the impact of noise, such as from power supply sources, digital switching and clocks and coupling between analog components. A normal AC/DC wall converter can introduce significant noise in the supply of 60 Hz and its harmonics. To alleviate this, it is preferred that a low dropout voltage regulator be used to provide a cleaner voltage source in view of the sensitivity of the elements such as the Wheatstone Bridge and the analog elements of the ADC.

In addition, various components in the PCB circuit draw power from the same voltage supply through copper traces in the PCB, however, as copper is not a perfect conductor, signals may interact with each other in an undesirable manner. This can be minimized or prevented by using multiple layers in the PCB. Traces are preferably cut in a manner so as to avoid interaction between analog and digital elements. Further, a larger ground plane may be used to provide low impedance return paths. To further minimize the impact of noise at higher frequencies, in one embodiment, decoupling capacitors C may be used and applied across the PCB near analog and digital inputs of the ADC. Such capacitors effectively "short" higher frequencies to ground preventing them from impacting the circuit.

The circuit includes the Wheatstone Bridge which, to function properly, must maintain a balanced configuration with all resistance values equal as noted above. High precision resistors are preferably incorporated to achieve such a purpose and functionality, with a preferred tolerance of no greater than about 0.1%, and preferably no greater than about 0.005% or lower.

The sensors and circuitry are mounted and in communication through the digital signal that is in communication with a computer.

Figure 4:
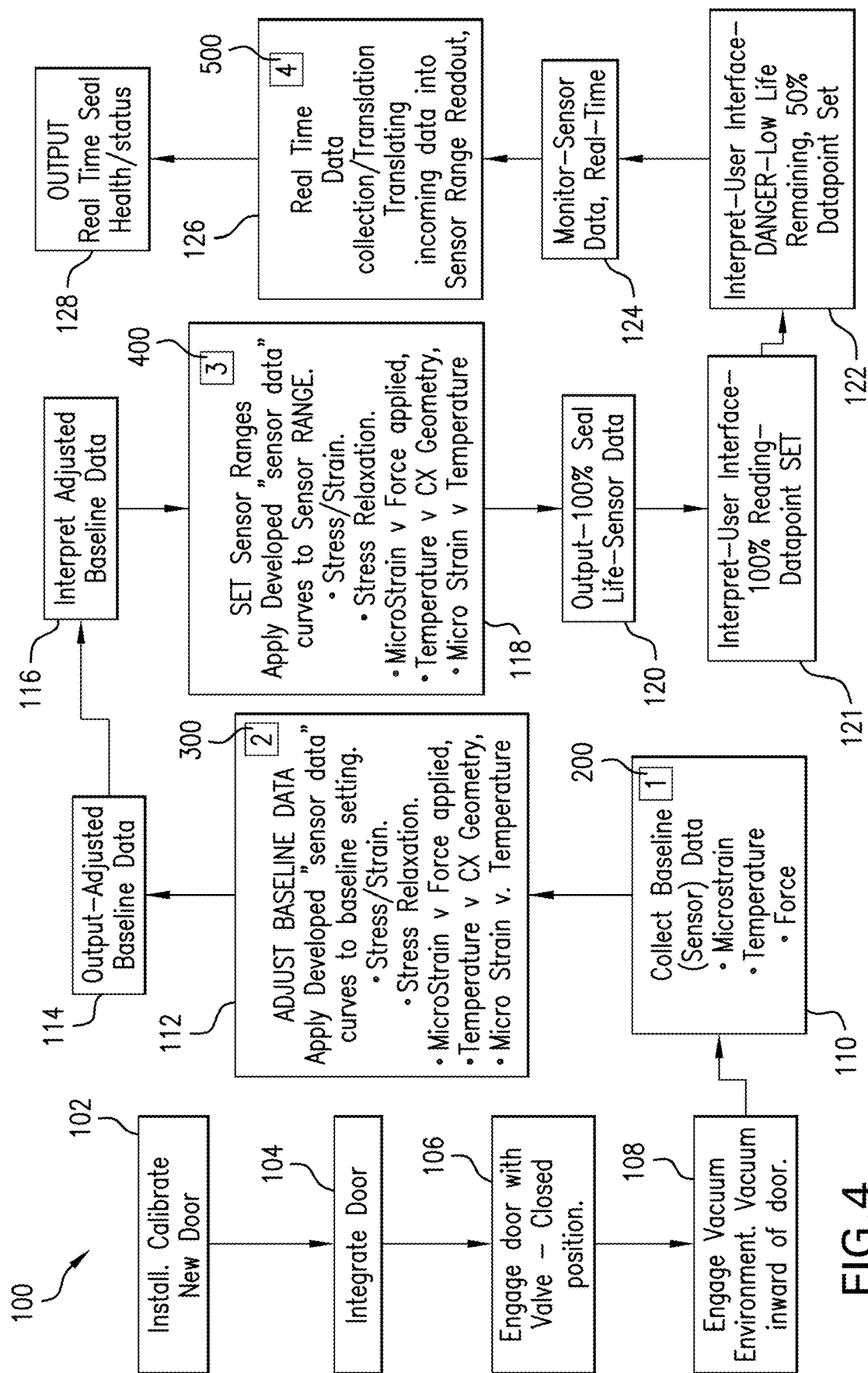
FIG. 4 is a flowchart illustrating example steps in an embodiment of the process and related system of the invention herein.

With reference to an overall process system as shown in FIG. 4, generally referred to as system 100 herein, implementations of the system 100 can use appropriate hardware or software; for example, the system 100 can execute and be capable of running an operating system such as the Microsoft Windows® operating systems, the Apple OS X® operating systems, the Apple IOS® platform, the Google Android™ platform, the Linux® operating system and other variants of UNIX® operating systems, and the like.

Some or all of the described functionality and signals provided can be implemented in and through software and/or hardware on a user device. A user device can include, but is not limited to, a computer, a smart phone, smart watch, tablet computer, portable computer, television, virtual reality goggles, a laptop, smart or dumb terminal, network computer, personal digital assistants, home assistants (such as Alexa™ or Google® Home™), which preferably have camera, wireless devices, information appliances, workstations, minicomputers, mainframe computers, or other computing devices, that is operated as a general purpose computer or a special purpose hardware device that can execute the functionality described herein. The software, for example, can be implemented on a general-purpose computing device in the form of a computer including a processing unit, a system memory, and a system bus that couples various system components including the system memory to the processing unit.

Additionally, or alternatively, some or all of the functionality can be performed remotely, in the cloud, or via software-as-a-service. For example, matching functions can be performed on one or more remote servers or other devices as described above that communicate with the user devices. The remote functionality can execute on server class computers that have sufficient memory, data storage, and processing power and that run a server class operating system (e.g., Oracle® Solaris®, GNU/Linux®, and the Microsoft® Windows® family of operating systems).

The systems can include a plurality of software processing modules stored in a memory and executed on a processor. By way of illustration, the program modules can be in the form of one or more suitable programming languages, which are converted to machine language or object code to allow the processor or processors to execute the instructions. The software can be in the form of a standalone application, implemented in a suitable programming language or framework.

Method steps of the techniques described herein can be performed by one or more programmable processors executing one or more computer programs to perform functions by operating on input data and generating output. Method steps can also be performed by, and apparatus can be implemented as, special purpose logic circuitry, e.g., an FPGA (field programmable gate array) or an ASIC (application-specific integrated circuit). Modules can refer to portions of the computer program and/or the processor/special circuitry that implements that functionality.

Processors suitable for the execution of a computer program include, by way of example, both general and special purpose microprocessors. Generally, a processor will receive instructions and data from a read-only memory or a random access memory or both. The essential elements of a computer are a processor for executing instructions and one or more memory devices for storing instructions and data. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. One or more memories can store media assets (e.g., audio, video, graphics, interface elements, and/or other media files), configuration files, and/or instructions that, when executed by a processor, form the modules, engines, and other components described herein and perform the functionality associated with the components. The processor and the memory can be supplemented by, or incorporated in, special purpose logic circuitry.

In various implementations, a user device includes a web browser, native application, or both, that facilitates execution of the functionality described herein. A web browser allows the device to request a web page or other downloadable program, applet, or document (e.g., from the server(s)) with a web page request. One example of a web page is a data file that includes computer executable or interpretable information, graphics, sound, text, and/or video, that can be displayed, executed, played, processed, streamed, and/or stored and that can contain links, or pointers, to other web pages. In one implementation, a user of the system may manually request a web page from the server. Alternatively, the device automatically makes requests with the web browser. This can enable the system to be implemented in multiple locations. Examples of commercially available web browser software include Google® Chrome®, Microsoft® Internet Explorer®, Mozilla® Firefox®, and Apple® Safari®.

In some implementations, the system includes client software. The client software provides functionality to the device that provides for the implementation and execution of the features described herein. The client software can be implemented in various forms, for example, it can be in the form of a native application, web page, widget, and/or Java, JavaScript, .Net, Silverlight, Flash, and/or other applet or plug-in that is downloaded to the device and runs in conjunction with the web browser. The client software and the web browser can be part of a single client-server interface; for example, the client software can be implemented as a plug-in to the web browser or to another framework or operating system. Other suitable client software architecture, including but not limited to widget frameworks and applet technology can also be employed with the client software. The software can also be locally stored and processed without access to web-based communication if only internal use of the system is being executed.

A communications network can connect the devices with one or more servers and/or with each other. The communication can take place over media such as standard telephone lines, LAN or WAN links (e.g., T1, T3, 56 kb, X.25), broadband connections (ISDN, Frame Relay, ATM), wireless links (802.11 (Wi-Fi), Bluetooth, GSM, CDMA, etc.), for example. Other communication media are possible. The network can carry TCP/IP protocol communications, and HTTP/HTTPS requests made by a web browser, and the connection between the clients and servers can be communicated over such TCP/IP networks. Other communication protocols are possible.

The system can also be practiced in distributed computing environments where tasks are performed by remote processing devices that are linked through a communications network. In a distributed computing environment, program modules can be located in both local and remote computer storage media including memory storage devices. Other types of system hardware and software than that described herein can also be used, depending on the capacity of the device and the amount of required data processing capability. The system can also be implemented on one or more virtual machines executing virtualized operating systems such as those mentioned above, and that operate on one or more computers having hardware such as that described herein.

In some cases, relational or other structured databases can provide such functionality, for example, as a database management system which stores data for processing. Examples of databases include the MySQL Database Server or ORACLE Database Server offered by ORACLE Corp. of Redwood Shores, California, the PostgreSQL Database Server by the PostgreSQL Global Development Group of Berkeley, California, or the DB2 Database Server offered by IBM.

It should also be noted that implementations of the systems and methods can be provided as one or more computer-readable programs embodied on or in one or more articles of manufacture. The program instructions can be encoded on an artificially generated propagated signal, e.g., a machine-generated electrical, optical, or electromagnetic signal that is generated to encode information for transmission to suitable receiver apparatus for execution by a data processing apparatus. For example, use of the Wheatstone Bridge described herein for converting micro strain data into a voltage difference which can be translated to an analog and then a digital signal. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

A user may engage the system through a user interface such as a welcome page, directing a user to login and select various options based on whether it is a system start up or during monitoring of an on-going application of the system. The interface may have a list or scroll-type option for allowing the user to select an operation.

On a primary page, the user may log in, and then begin the method illustrated in FIG. 4 by engaging the system in an initial step 102 of installation of a BSV. In the installation, a preferred first step 102 of the system 100 would also include calibration of a newly installed door. The door may be any suitable gate or bonded slit valve having a seal. The seal may be any of those noted above and may be permanently bonded or set at installation. The door is then preferably integrated in step 104 into the system 100 by ensuring the door is properly installed and balanced for the vacuum and operation environment.

The door preferably has one or more sensors as described above mounted on the door in one or more locations for measuring micro strain on the door. The door is then put into operation by engaging the door valve in the closed position in step 106. Operation of such doors is known in the art and any valve operation for opening and closing the BSV or other door may be used within the scope of the process. In addition, other sensors can be incorporated into the process equipment to measure temperature, pressure and other reaction conditions for later analysis and coordination for predictive seal life of the seal in the BSV in that particular process.

Once the door is engaged in the closed position, in step 108, and the door is then under a pressure load, the vacuum is engaged within the system to pull vacuum pressure on the side of the door facing the inside of the reaction chamber as would occur in normal operation of a BSV or other similar door. Baseline data is then collected in step 110 using at least one micro strain sensor and any other sensors placed in the system for measuring pressure, temperature and/or force on the seal. The baseline data is important for later comparison and analysis against a database, such as a learning database or other similar data cache. The baseline at initial use zeros out the system as represents 100% seal life/effectiveness. The baseline data is then adjusted in step 112, by applying, in real-time, developed data from the sensors in place based on curves generated by sensor(s) performance against the baseline data yielding stress/strain curves, stress relaxation curves, micro strain evaluated against microforce using data from the measured force applied, evaluated temperature against the cross-sectional geometry of the seal and curves representing the impact of temperature on micro strain. The generated data base of relationship information is compared to the baseline data to establish an output in the form of the adjusted baseline data in real time.

The adjusted base line data is then evaluated and interpreted in step 114. Sensor data for the sensor data database is developed by executing the steps at varying sensor levels and measuring the data at those set levels of seal life to generate a database for use in the system for the same type of door and seal assembly which is interpreted based on varying relationships among the sensor data. Using established curves, the micro stress/micro strain, stress relaxation, micro strain measured against the acting vacuum pressure force on the door, temperature as evaluated against the seal cross-sectional geometry and the effect of temperature on micro strain are compared to the adjusted base line data to determine seal life in real time. The user interface provides a manner in which a user can view the data in real-time and can interpret the data for adjusting the process or adapting the seal for maximizing seal life.

The incoming data is interpreted in step 116 and translated using the system software based on developed algorithms (which can be varied depending on the relationships that are tracked) to translate the incoming sensor range data 118 developed from the adjusted baseline data measured at different levels, e.g., at 100% in step 120, which is interpreted in step 121 and further at 50% as interpreted in step 122 based on the sensor range data 118. The on-going status is then measured in real-time 124, and interpreted and translated 126 using the sensor range baseline data as interpreted to provide a basis for evaluating real-time measurement data from monitoring 124 to provide output data 126 that measures seal health and status at a point in the life of a seal.

Figure 5:
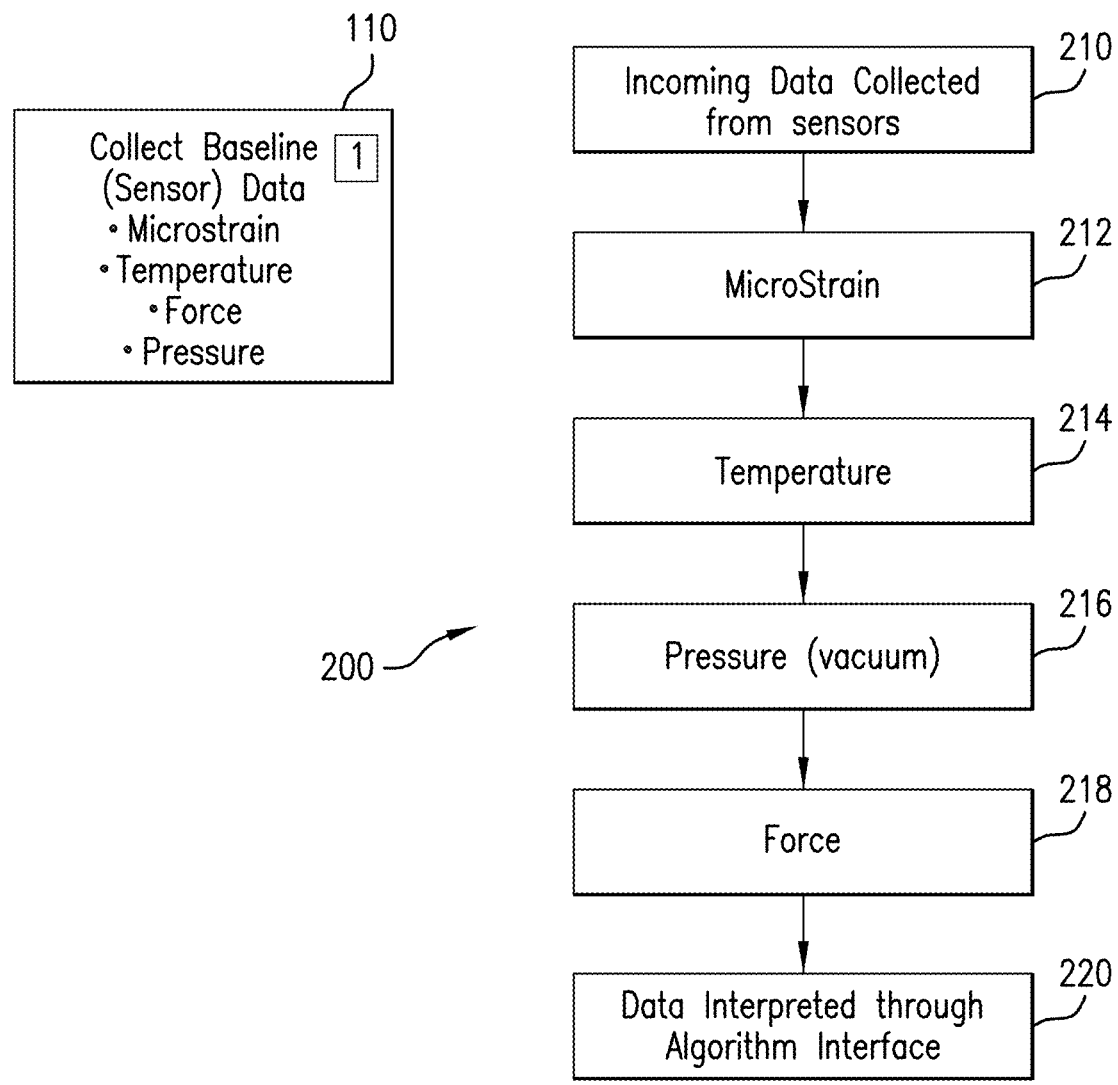
FIG. 5 is a more detailed process flowchart illustrating substeps in the step of collection of baseline data from the overall flowchart in FIG. 4.

With reference to FIG. 5, the step of collection of baseline data in step 110 is explained further in data collection substeps 200. Data is provided through sensors in step 210, including the sensors described above for receiving micro strain data 212, temperature data 214, pressure from vacuum 216, force on the door 218 resulting from such pressure, or another source, and such collected data is input into developed algorithms 220. The door with seal is installed in a BSV valve to form a valve assembly having the door and the door is activated. The door then engages the sealing surface under a load/force. The vacuum force thus engaged is applied against the interior facing side of the door and on the seal. The baseline sensor data is then established.

Figure 6:
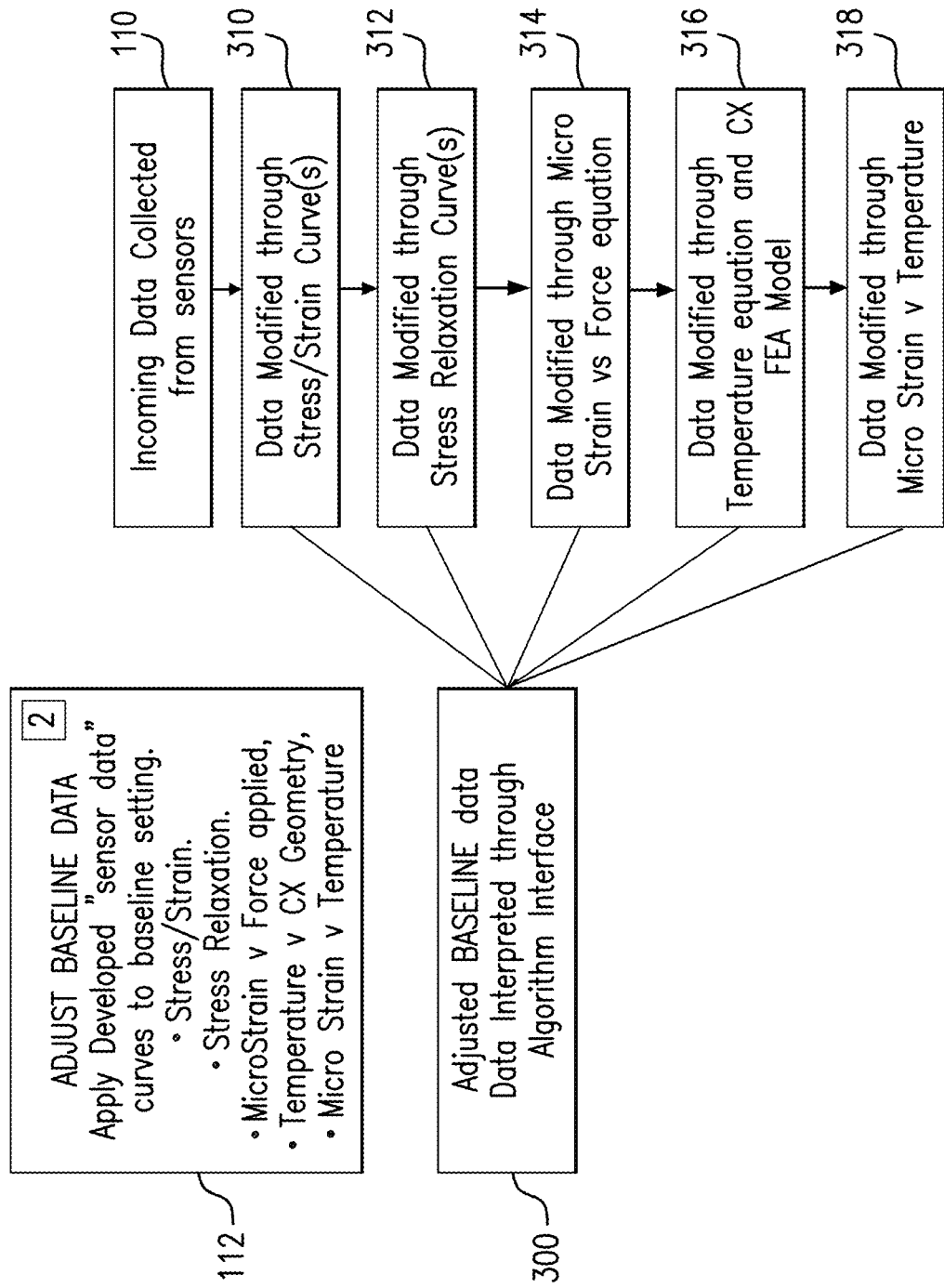
FIG. 6 is a more detailed process flowchart illustrating substeps in the step of adjusting the baseline data from the overall flowchart in FIG. 4.

With reference to FIG. 6, incoming data collected in 110 above is adjusted in step 112. The adjusted data 112 is modified as shown in FIG. 6 in substeps 300 through stress/strain curve(s) 310, through stress relaxation curve(s) 312, through a relationship equation defining the relationship of micro strain against force 314, through an equation defining the impact of temperature on seal cross-sectional geometry 316, and from the measured effect of ambient operation temperature on micro strain 318 developed from measurements of data at varying levels of seal life in the data base which was evaluated to provide appropriate curves and equations that were incorporated into algorithm(s) for adjusting the baseline data. Initial sensor data is collected and then calibrated to consider the effects on the data that occur from different physical phenomenon. Based on collected (modeled or measured) data, values are assigned to different characteristics as noted above effecting sensor data collected 110. Multiple variables, however, can be employed and monitored in view of its impact on the physical properties of the material over time as the seal degrades over time.

For development of data, one may vary the force of the valve (load), the extent of vacuum pulled, the physical erosion by changes in geometry and accumulate and build data over time to further develop the algorithm and accuracy of the monitoring. The data may be continuously fed and calibrated with each application of a load, with load applied, load held and load released, for an operation cycle on each valve assembly, e.g., in a BSV on each door closed, door held shut in operation, door opened cycles. Such cycles, for data collection or in use, to generate operational data, may be cycled for about 1,000 to 1,800 times, and in use, can be cycled during all operational use cycles. In end applications, calibration will be required each time a new seal/valve assembly is incorporated into an application (e.g., when a new door is installed). Thus, in the initial step, the door is installed, then the door is engaged under load and calibrated, and then the door is engaged in live operation with the sensors placed feeding live data to the system in which the algorithm would be employed to analyze the data and display real-time seal health data to the user.

With respect to the algorithm as discussed above, an exemplary algorithm is provided below:

$$\text{Micro strain} = x(\text{Force}) + y(\text{Stress/Strain}) + z(\text{stress relaxation}) + e(\text{temperature effect}) + f(\text{seal cross-sectional geometry}) + g(\text{atmospheric pressure force})$$

wherein the variables x, y, z, e, f, g are each ratios (percentages) of the overall micro strain reading. The percentages (constants) are determined by internal models and testing as described in the Examples herein.

Figure 7:
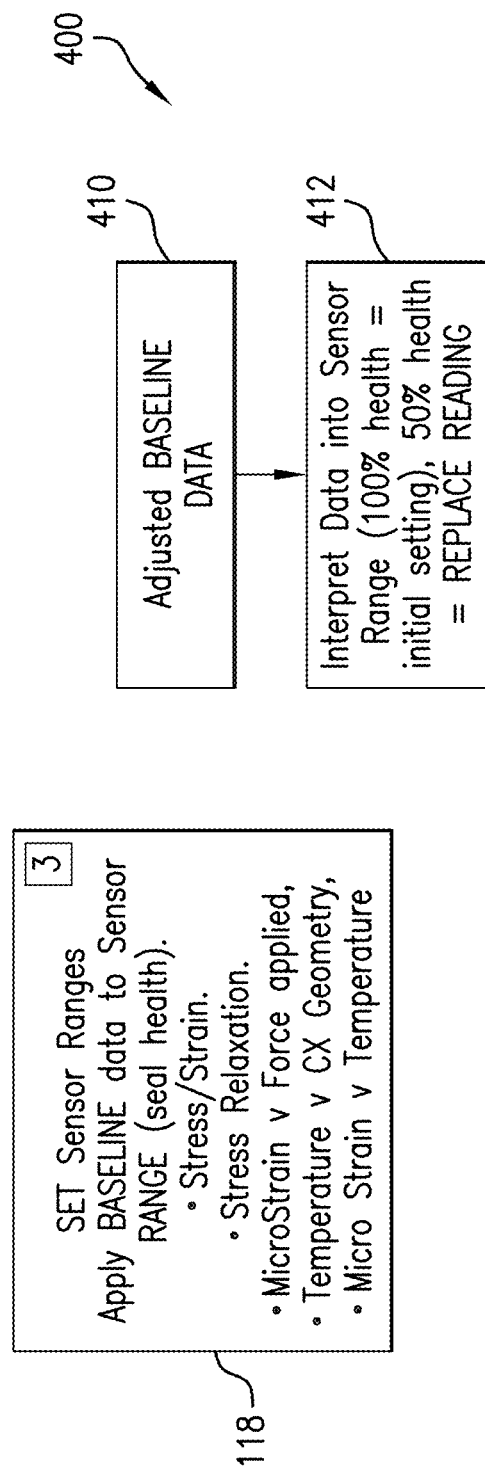
FIG. 7 is a more detailed process flowchart illustrating substeps in the step of interpreting the adjusted baseline data to set the ranges for coverage and interpretation.

As noted in FIG. 7, the adjusted base line data from 118 is then used to interpret the adjusted baseline data in substeps 400. The adjusted baseline data 118 is used in substep 410 and interpreted into ranges. Assuming the initial data point at start is 100% seal life (at the top of seal life range), then extrapolated data will be set at 50% (which is used as a low end of the interpreted range) in step 412. The selection of 50% as a low point is merely a preference in evaluating seal life data. The low point could be higher (if there were a level of degradation below which a potential user did not wish to map or evaluate) or lower than 50% if a more detailed analysis and/or a higher level of degradation could be tolerated (e.g., in a lower pressure process). The data thus extrapolated provides the range that can be compared to signals which are sent to an end user interface indicating the seal health in comparison to the ranges as a function of incoming sensor data. In some instances, for example, because conditions may vary, a change in micro strain can be as low as about 20 micro strain or as high as about 150 micro strain between a new and a degraded seal with other conditions being similar simply because of variations in applied door pressure. However, such relationships may also vary and impact variations in micro strain depending on the impact of the environment of operation or other ambient operating conditions such as temperature, pressure, load or other force on the BSV. Thus, it is important to monitor and develop relationships for different processes using baseline and adjusted baseline data so that the change in micro strain can be analyzed against existing data to best predict and evaluate seal life and to assist in filtering out noise from the impact of ambient or other operationally monitored conditions.

Figure 8:
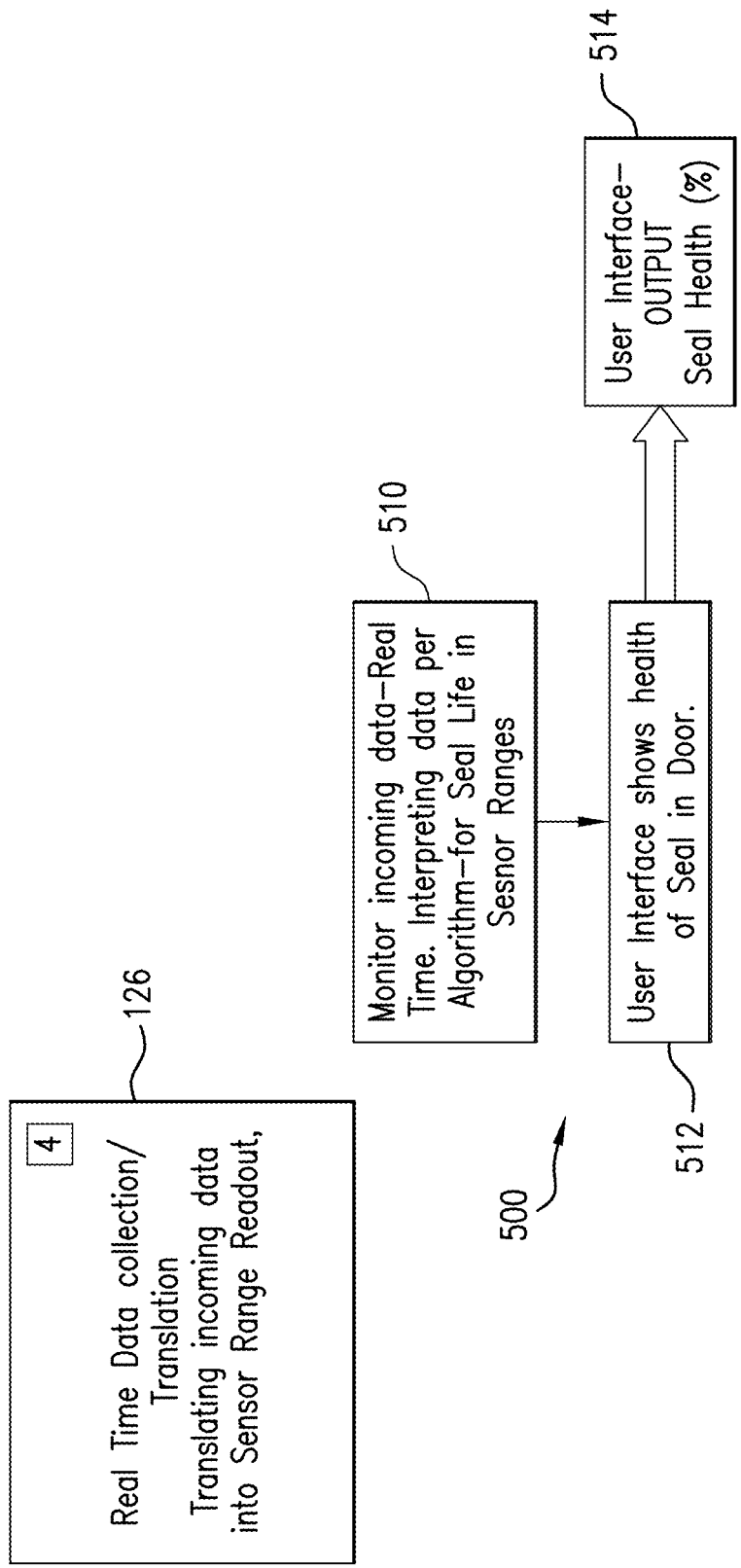
FIG. 8 is a more detailed process flowchart illustrating substeps in the collection and translation of real-time data.

As shown in FIG. 8, real-time data collection is monitored while a process is on-going, and the data is interpreted using an algorithm as noted above for determining seal life within the ranges used for the adjusted baseline data in substep 510. Each time the system is engaged, a load is applied by the door linkage when the door is closed such that data is developed while the door is engaged (under a load) and when the vacuum pressure is engaged. The closed door baseline data is for initial calibration, and as the system collects data in an on-going manner, each time the system is engaged it generates an initial calibration baseline, and on-going data collection in use.

It will be understood by one skilled in the art, as discussed above, and based on this disclosure, that the ranges adopted for adjusted baseline data and real time monitoring can be modified to vary from 50% to 100%, but can have a higher or lower end point, e.g., a low point as low as perhaps about 30% or as high as 70%, depending on the actual intended use and/or the desired level of data analysis to be performed. The seal health in real time is then provided to the user on the user interface in 512 as a measure of seal life measured in a percentage of 100% health 514.

EXAMPLES

The invention will now be described in connection with the following non-limiting Examples.

Example 1

Figure 9B:
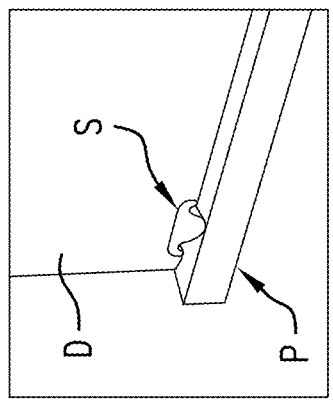
FIG. 9B is an enlarged view of the seal in the slit valve door of FIG. 9A.
Figure 9D:
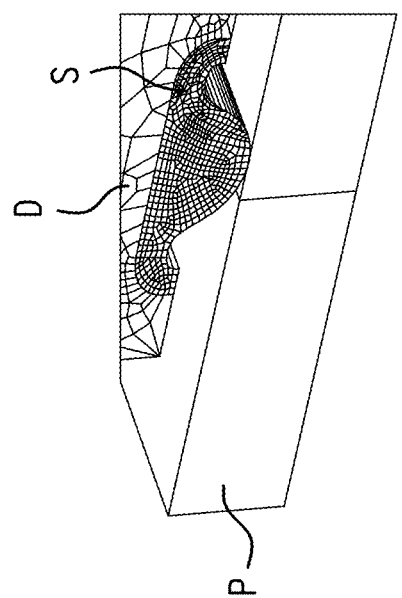
FIG. 9D is a greatly enlarged view of the seal area showing the seal, door and plate of FIG. 9C including the geometry.
Figure 9A:
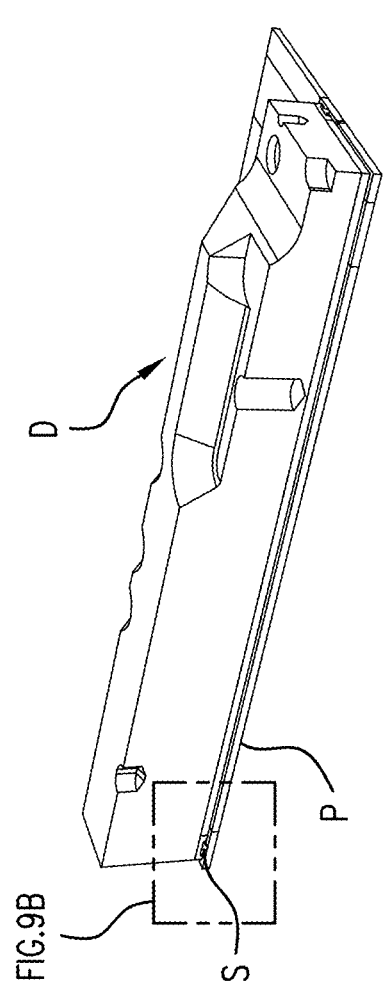
FIG. 9A is a perspective representation of a quarter of an embodiment of a slit valve door having a seal installed within a groove within the door on a plate used for testing in the Examples herein.
Figure 9C:
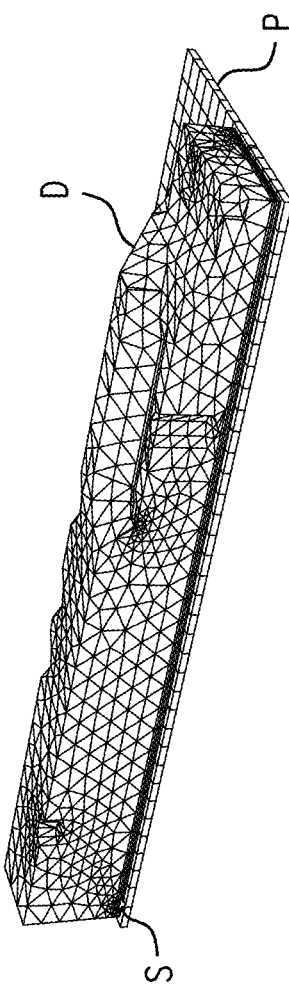
FIG. 9C is an enlarged view of the geometry of the door, seal and plate of FIG. 9A.

To initially evaluate seal behavior, a BSV model door D with ¼ symmetry was used as a base level testing sample. See FIGS. 9A-9D. In modeling the finite element analysis, the model was based on a BSV including a Chemraz® BSV, wherein the seal was a ¼ symmetry Chemraz® 656 seal S (i.e., a seal having a cross-sectional view as shown in FIGS. 9A, B and 9D), and an 8-node, linear brick seal, door and plate. See FIGS. 9A-9D. The seal S and door D were modeled further in finite element analysis as a hybrid, with reduced integration and hourglass control. The plate P (FIGS. 9A, 9B and 9D) was also modeled with reduced integration and hourglass control, and the door (FIGS. 9A-9D) was modeled using a 4-node linear tetrahedron in ¼ symmetry. The modeling of the seal included those characteristics to be evaluated and taken into account for the purpose of finite element analysis in the model described herein.

Figure 10:
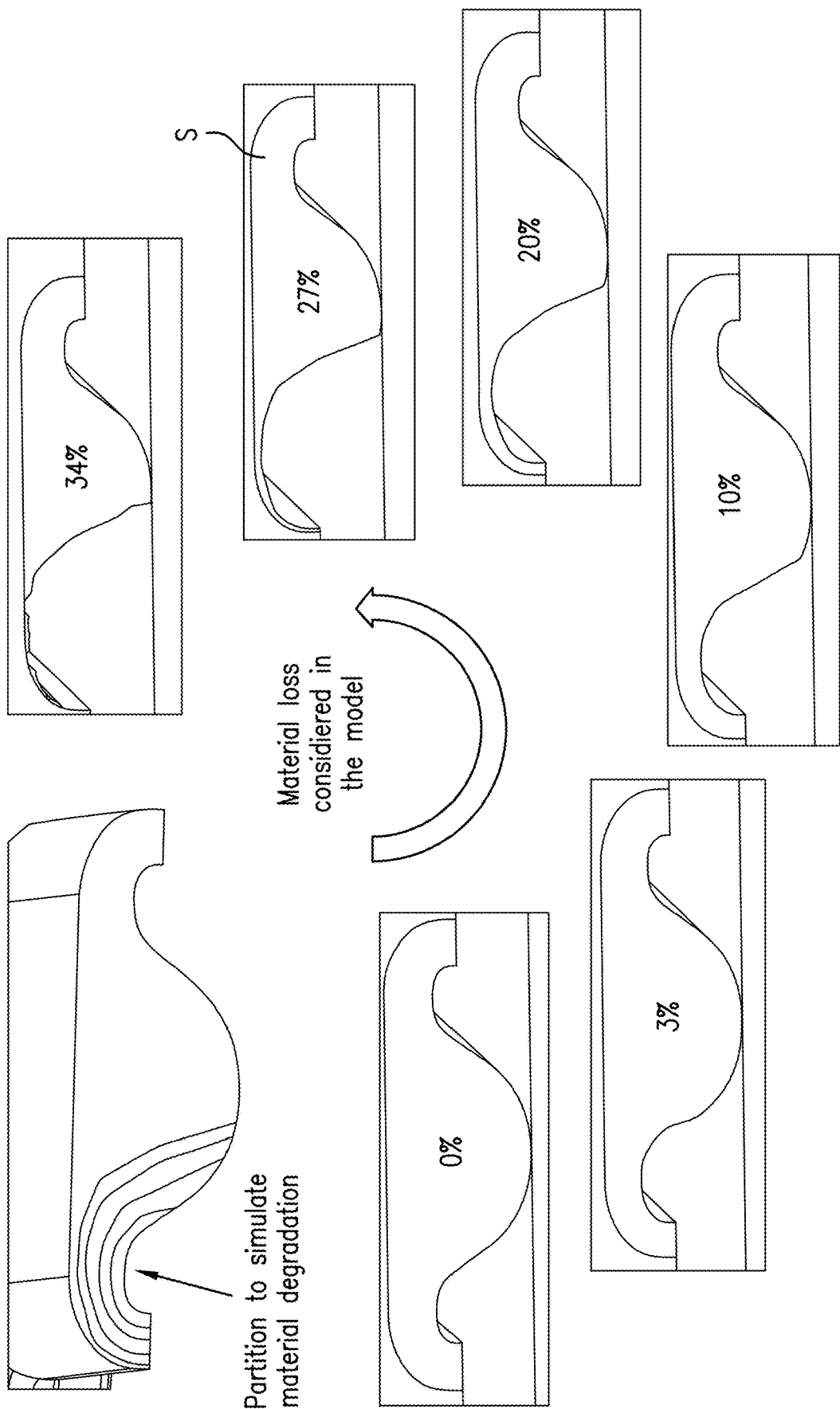
FIG. 10 is an illustration of cross-sectional views of seals partitioned for degradation at varying levels for use in testing in Examples herein.
Figure 11:
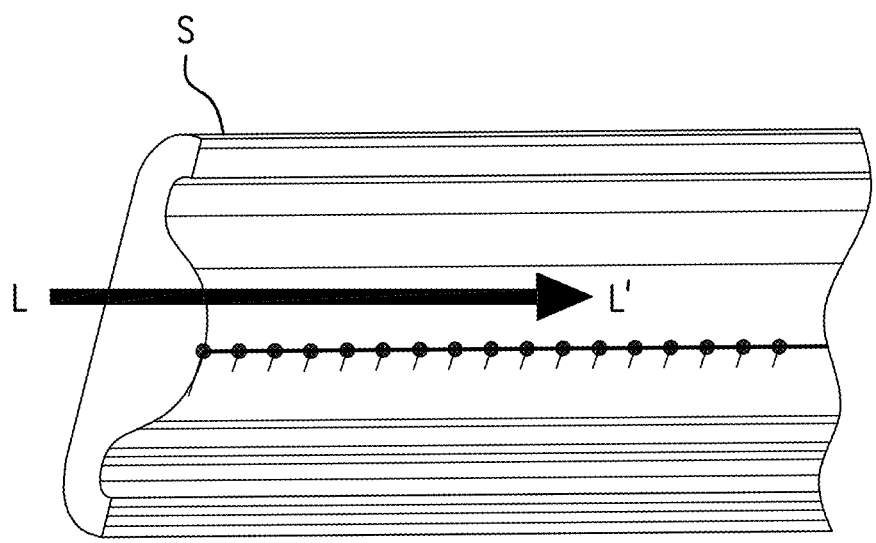
FIG. 11 is a perspective view of the example seal used in testing in the Examples herein showing the longitudinal central path (measured in inches) along which pressure was applied to the partitioned seals.
Figure 12:
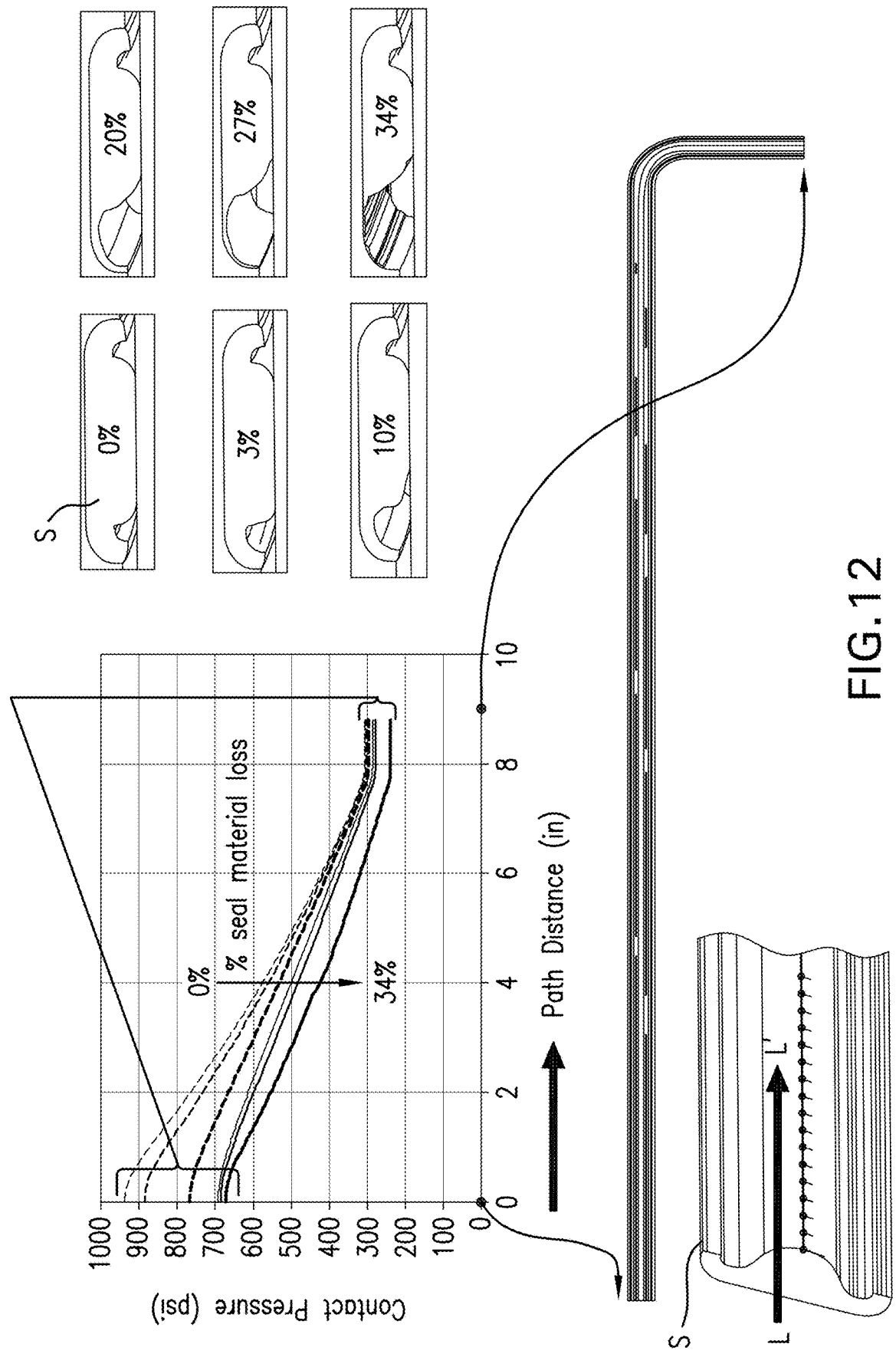
FIG. 12 is graphical representation and illustration of the impact of contact pressure on seals being tested in the Examples herein at varying levels of degradation along the path of the seal being tested (as shown in FIG. 11)

Degradation was modeled by partitioning the seal at 0%, 3%, 10%, 20%, 27% and 34% seal loss to simulate seal degradation. See FIG. 10. The BSV model was subjected to various levels of contact pressure along a longitudinal central path (measured in inches) along the partitioned seal. As seen in FIG. 11 percentage loss of materials is shown and was taken into account in the algorithm model (the seals are shown in a representative manner and in an undeformed state). The impact on the seal along the path L-L' and as simulated degradation increases (i.e., as the seal becomes more vulnerable losing material), demonstrates a change in behavior over time and along the seal. See FIG. 12 including the impact of contact pressure on the seals at varying levels of degradation along the path of the seal and as shown as seals S in a deformed state.

Example 2

Figure 13:
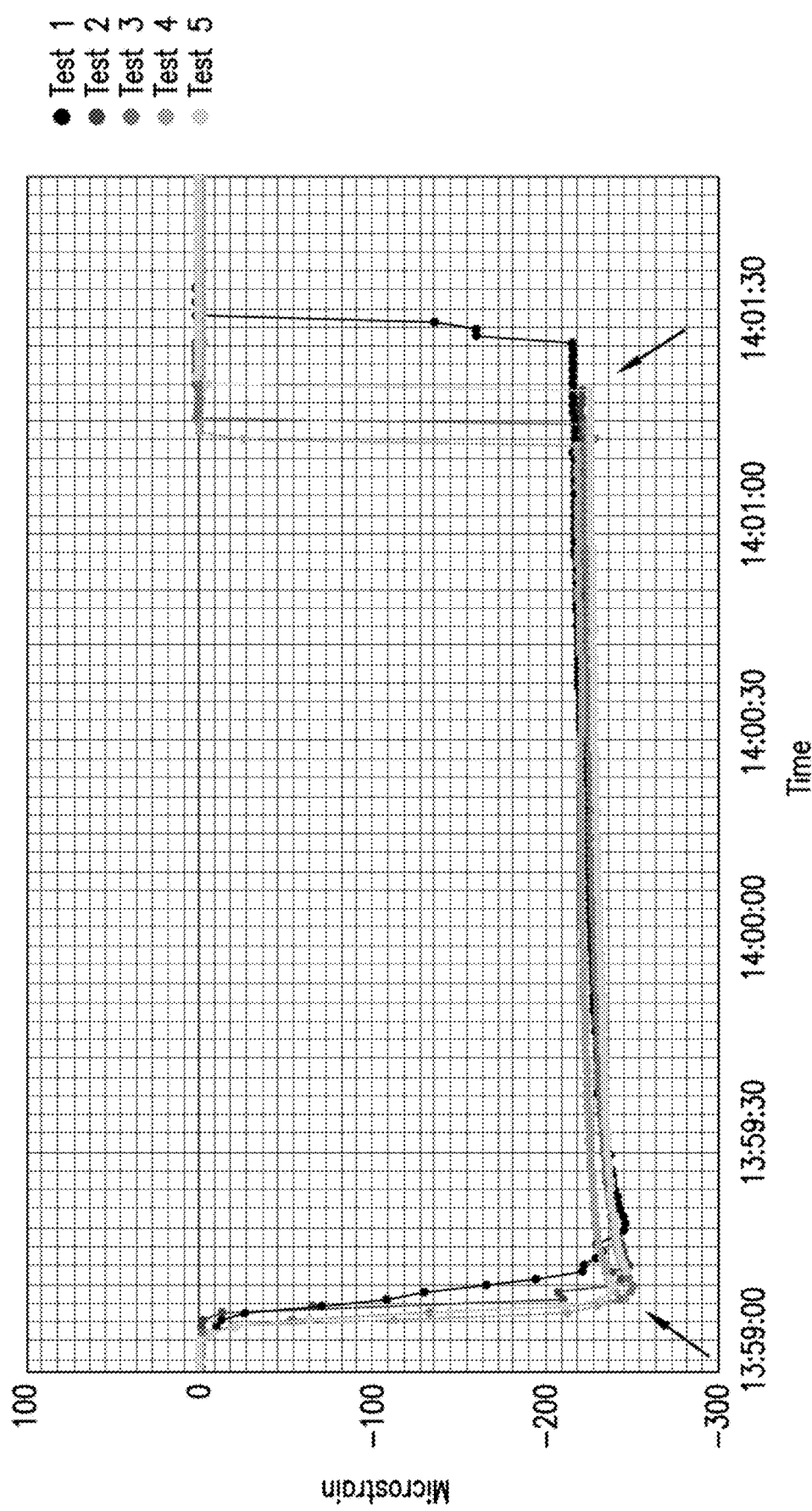
FIG. 13 is a graphical representation of the impact on micro strain measured as pressure was applied at an initial level and held for a period of time for two minutes in the Examples herein showing an average change in micro strain on a 1 cm BSV door in one example of about 26.6 micro strain.
Figure 14:
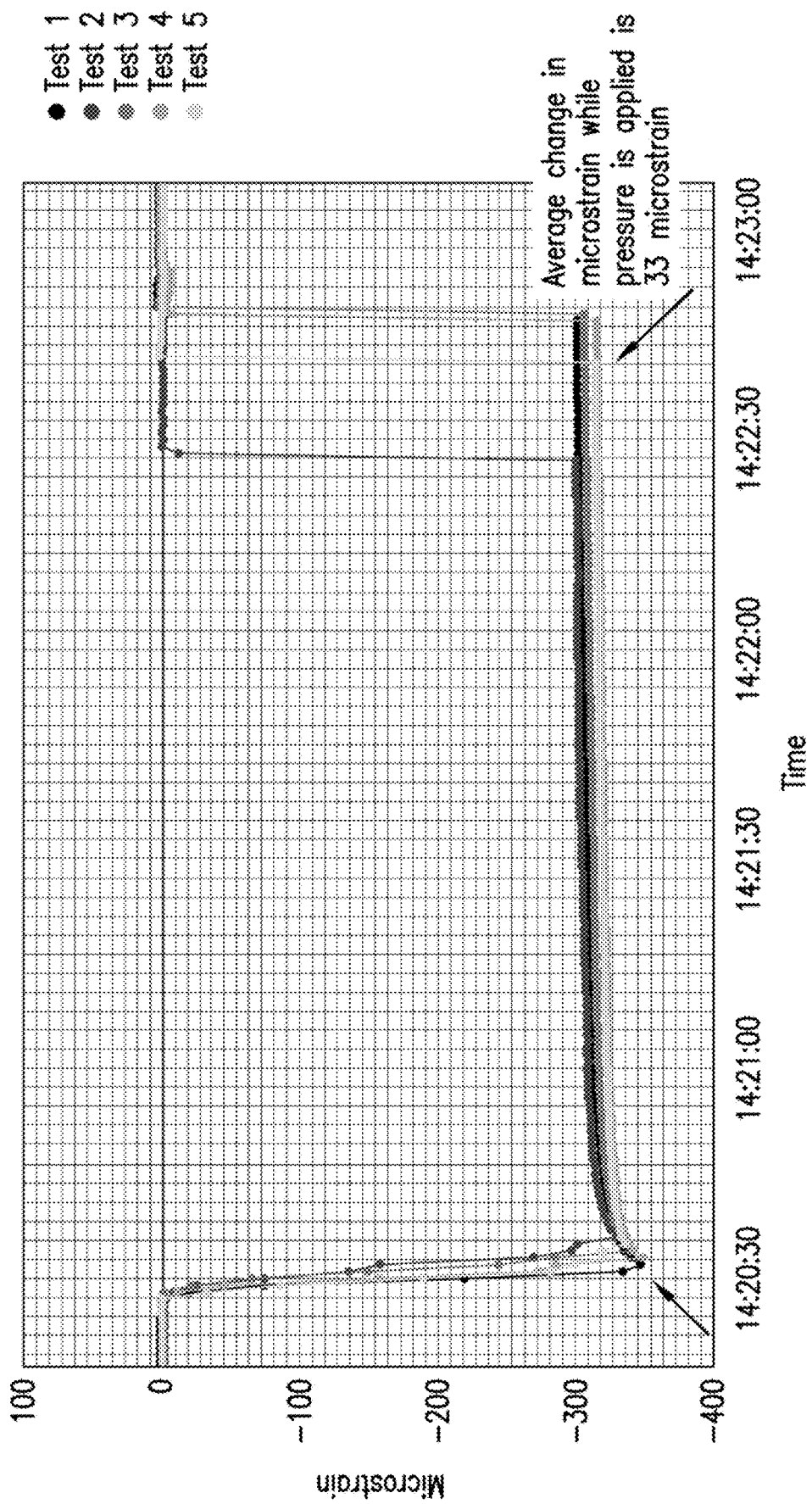
FIG. 14 is a further graphical representation of the impact on micro strain on a 1 mm BSV as pressure was applied at an initial level and held for a period of time for two minutes in the Examples herein showing an average change in micro strain of about 33 micro strain.

Test BSVs were prepared and a strain gage measured and integrated on the doors and the door stacked on another door for testing. The impact on micro strain was measured as pressure was applied at an initial level and held for a period of time for two minutes. The change in micro strain on a 1 cm BSV door was about 26.6 micro strain. See FIG. 13. On a 1 mm BSV, the average change in micro strain while pressure was applied was about 33 micro strain. See FIG. 14. Measurement of the voltage from a Wheatstone Bridge was calculated based on the micro strain. and a voltage of 0.825 mV was measured as output voltage when 5 V was applied corresponding to an average measured strain of 330 $\times 10^{-6}$, i.e., 33 micro strain.

Further circuits were incorporated including an AD7799 combined instrumentation amplifier and a voltage regulator. See, experimental circuit shown in FIG. 3. While this example circuit was used, others could have been designed to achieve the purpose.

Figure 15:
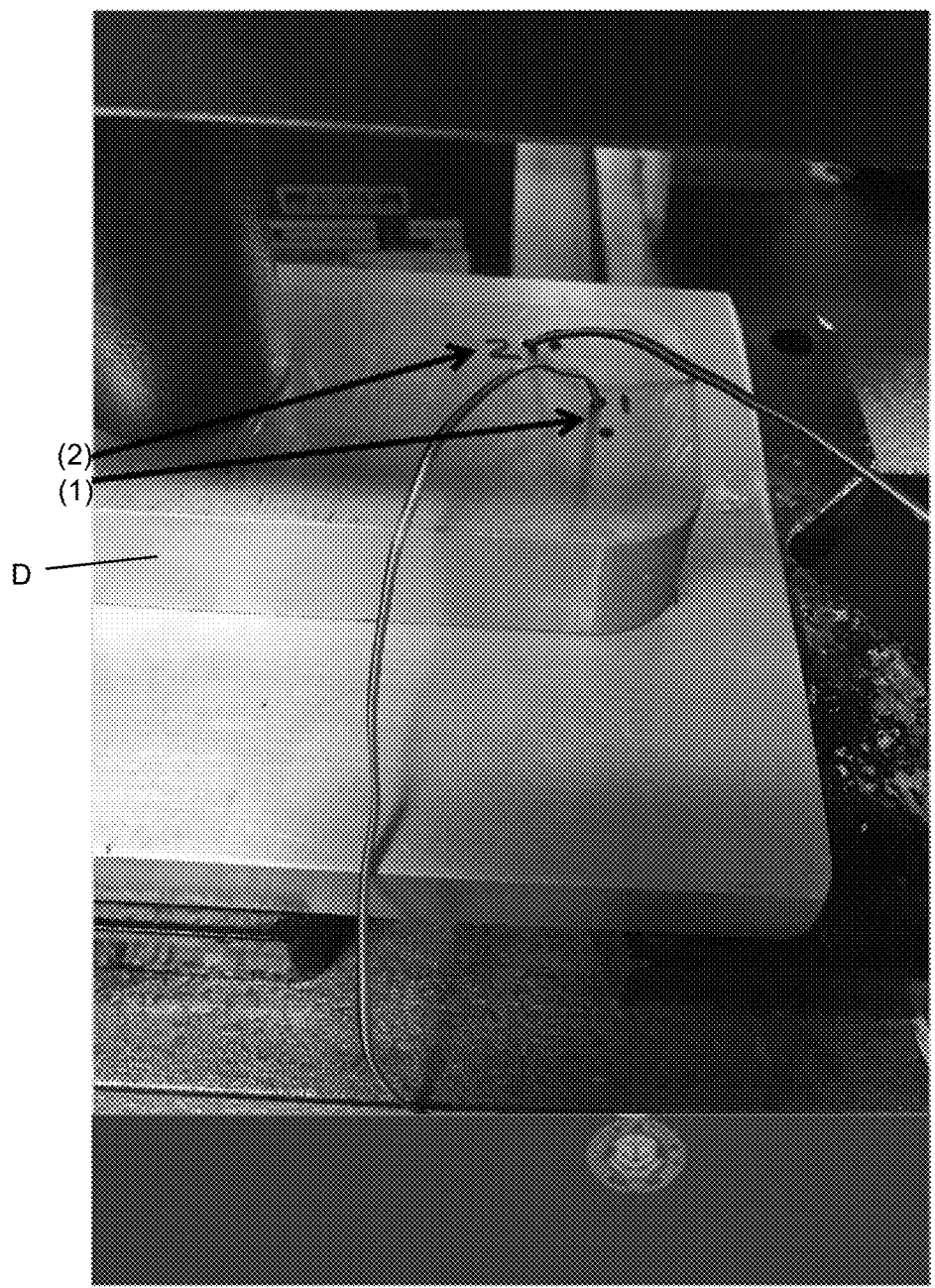
FIG. 15 is an illustration of placement of two strain gages in parallel and perpendicular orientations on a slit valve door outer surface.
Figure 16:
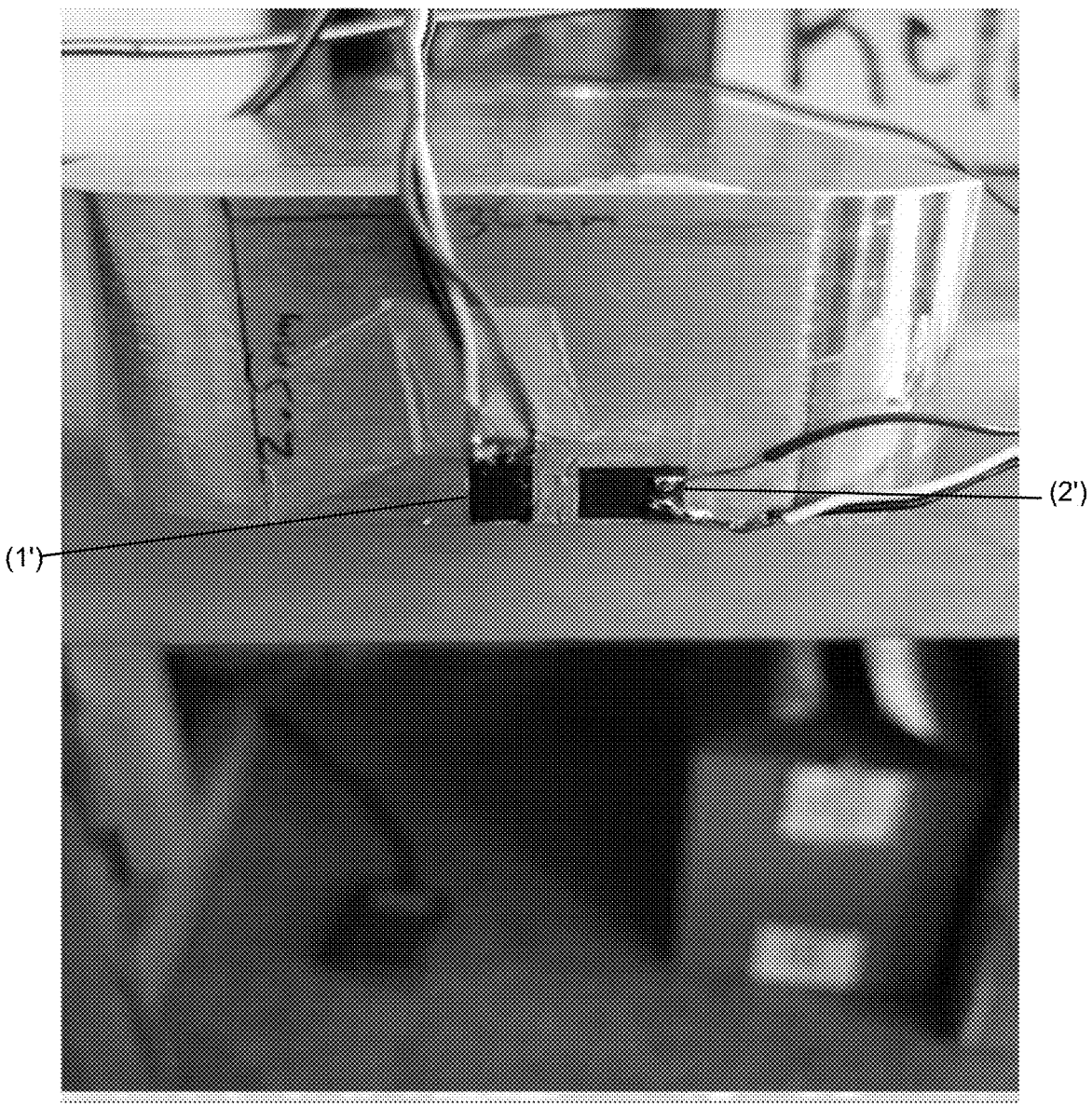
FIG. 16 is an illustration of placement of two strain gages in parallel and perpendicular orientations on a slit valve door side surface.

Based on evaluations, it was determined that the best resolution and data were generated by placing the strain gage on the face of the BSV and recessed within the door with an opening for wires to pass through. Two gages, one parallel (2) and one perpendicular (1) also performed in a preferred manner. See FIG. 15. A similar trial was run with strain gages in perpendicular (1') and parallel (2') positions on the side of the door. See FIG. 16.

Example 3

Four strain gages were placed on perimeter areas of a BSV door as close to the seal as possible. Forces applied to the door are simulated for testing purposes are simulated using an Instron Tensile Tester using compression testing. A 7 kN load was applied to the door for over 10 seconds, then held for two minutes and released for a further 10 seconds. Cycling of the load (load on, load held, and load released) was carried out repeatedly for at about 1,000 hours. A data acquisition system was employed to measure the strain gage reading and was modified in a manner known by those skilled in the art so as to negate strain fluctuations from ambient temperature changes. Testing was conducted on two different BSV doors. One of the BSV doors was new, and one was a seal with simulated degradation through cutting the inside edge of the seal with a computer numerically controlled (CNC) machine.

The degraded door was cut twice and molds of the O-rings at different levels of degradation were taken for correlating simulated degradation to O-ring health. Tests of the two doors were conducted under both conditions of load and no load.

Figure 17:
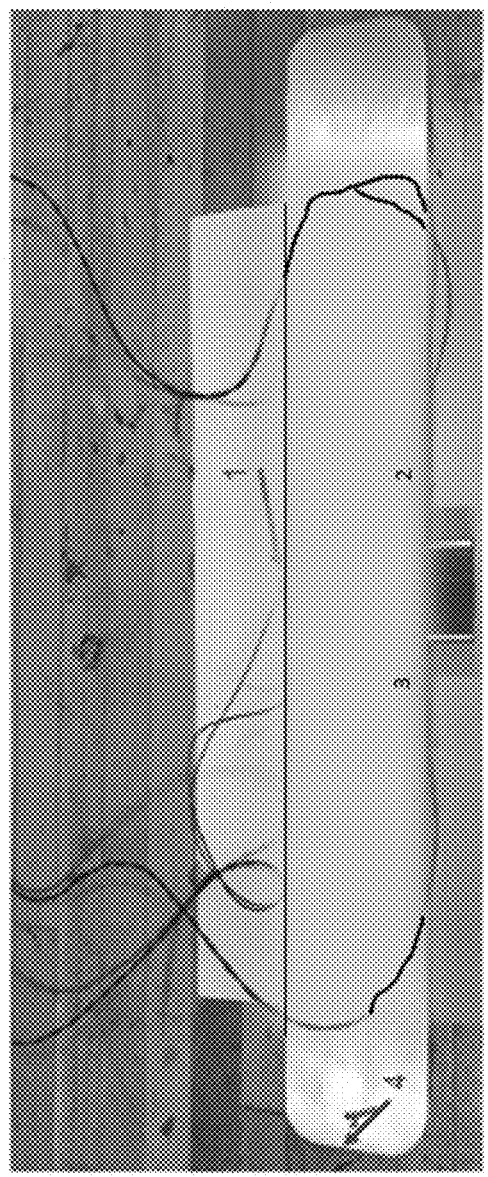
FIG. 17 is a photographic representation of a new BSV in Example 3 herein having strain gages in different locations and not subject to a load.
Figure 18:
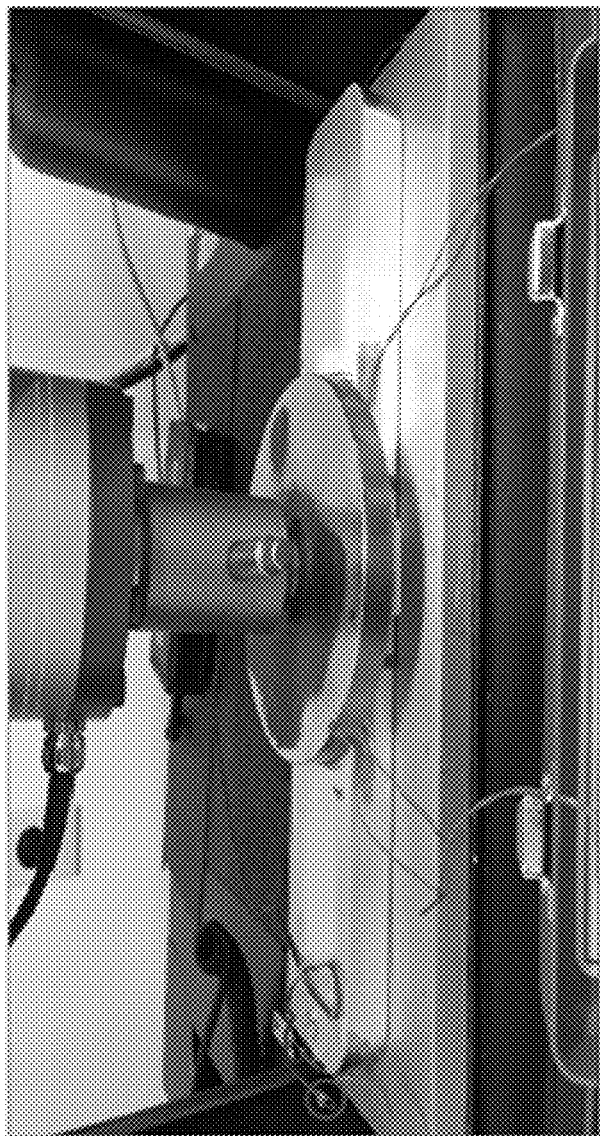
FIG. 18 is a photographic representation of a simulated degraded BSV in Example 3 having strain gages in different locations and having a load applied thereon.

FIG. 17 shows the new BSV having strain gages in different locations 1 (Back Center), 2 (Front Right), 3 (Front Left) and 4 (Far Left). A degraded BSV door with the same number of strain gages in the same locations on the door but with an additional thermocouple for temperature tracking was also employed. Each BSV was evaluated both with and without a load. As an example, a representative photo of the degraded BSV subject to a load is shown in FIG. 18.

Figure 19:
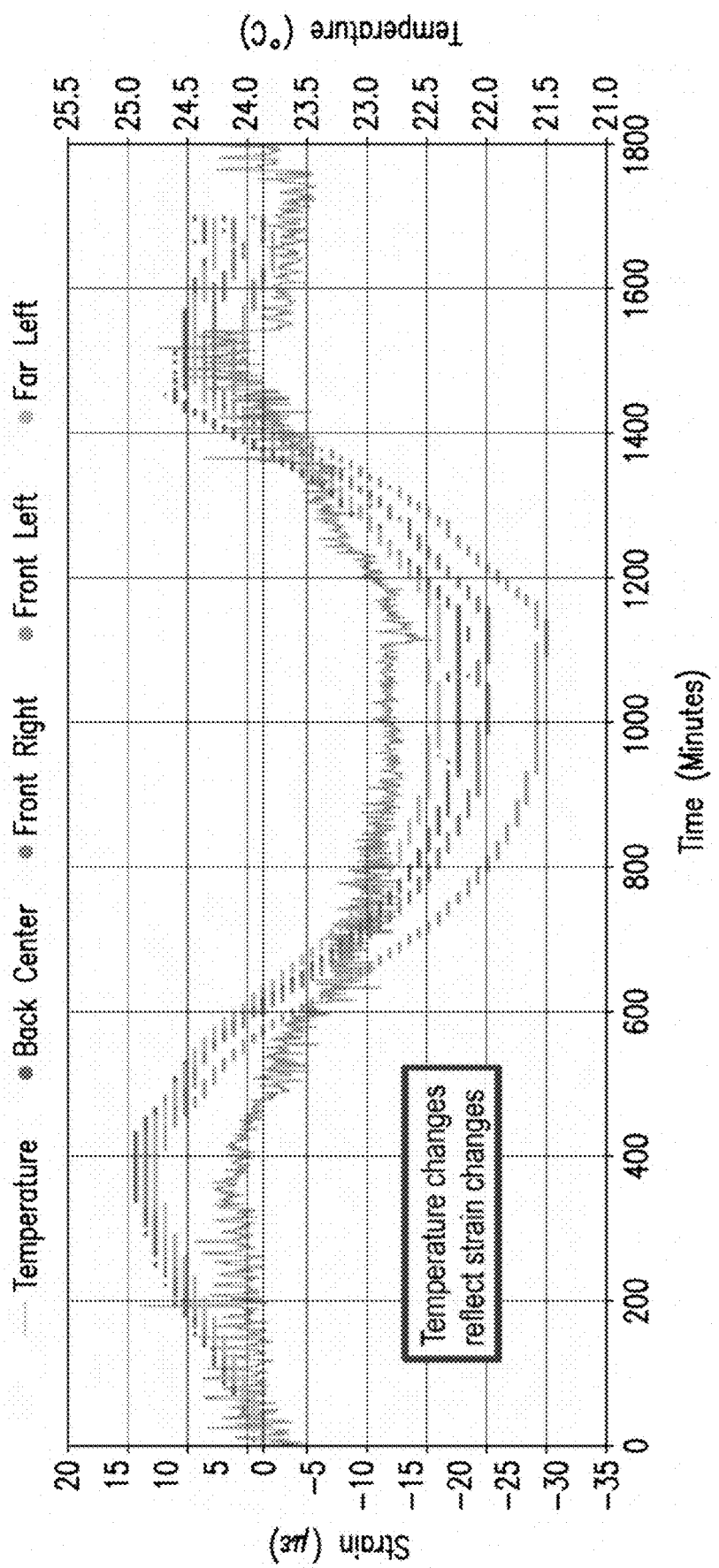
FIG. 19 is a graphical representation showing the impact of temperature on strain data over time for the new BSV door having four strain gages from Example 3 without an applied load.

FIG. 19 is a graphical representation showing the impact of temperature on strain data over time from evaluation of the new BSV door having four strain gages as noted above and a thermocouple without use of a load.

Changes in strain on various points of the door correspond to ambient temperature changes in the room. From the graphical representation and data, one can determine that on average over the entire door, a temperature variation of +1° C. in room temperature can yield a ±20µε response.

Figure 20:
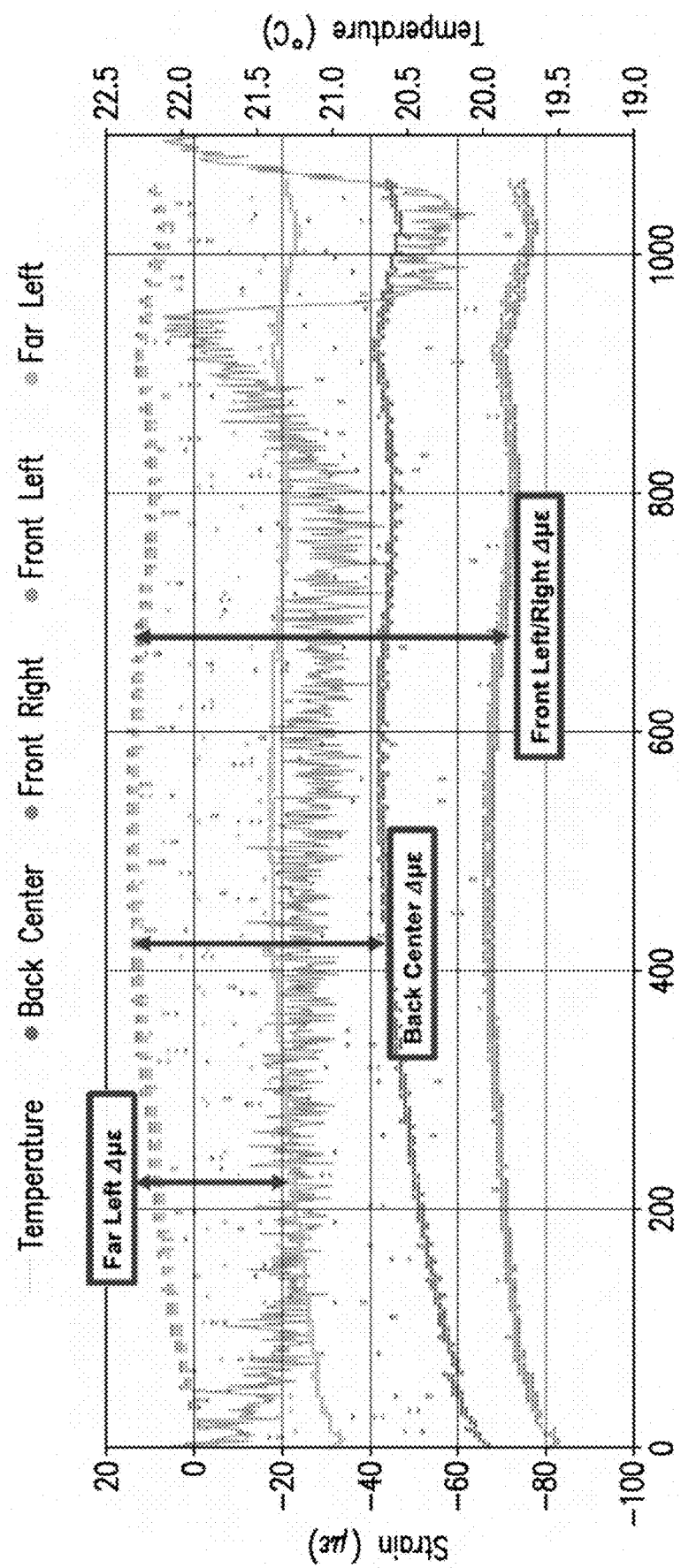
FIG. 20 is a graphical representation showing the impact of temperature on strain data over time for the new BSV of FIG. 19 under an applied load.

FIG. 20 shows a graphical representation of the relationship of micro strain and temperature over time for a new BSV door having four strain gages positioned as noted above, and a thermocouple, but with a door under an applied load. The ambient temperature changes still had an effect on strain during compression testing. This is most noticeable between 800 and 1000 minutes. A temperature change of =1° C. yielded a strain response of +4µε, 80% less than when no load was applied.

Figure 21:
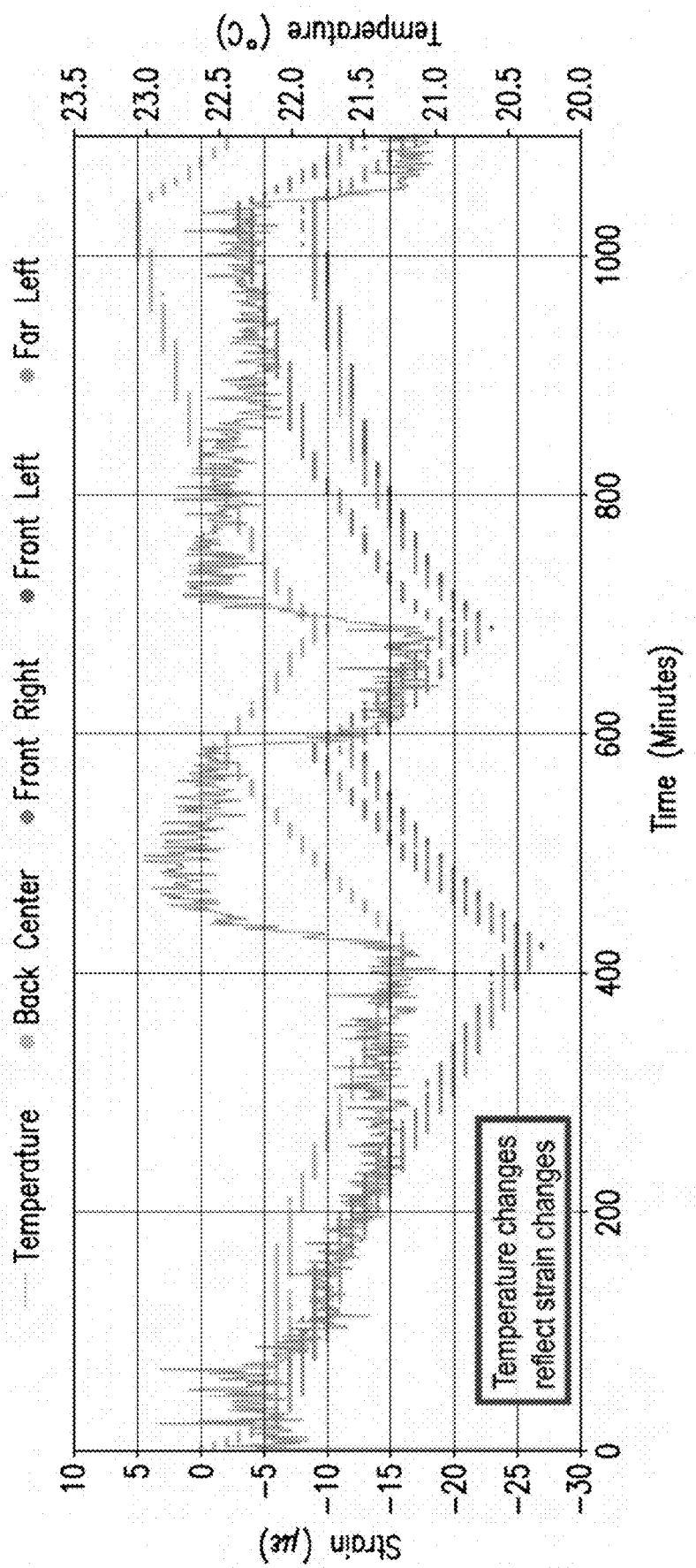
FIG. 21 is a graphical representation showing the impact of temperature on strain data over time for a simulated degraded BSV having four strain gauges without an applied load.

FIG. 21 shows a graphical representation of the relationship of micro strain and temperature over time for a simulated degraded BSV having four strain gages positioned in the same manner as the new BSV and with a thermocouple without application of a load. The changes in strain on various points of the door correspond to ambient temperature changes in the room. From the data and graph, it was determined that on average over the entire door, a ±1° C. change in room temperature yielded a ±15µε response, which was 5µε less than the new BSV without a load.

Figure 22:
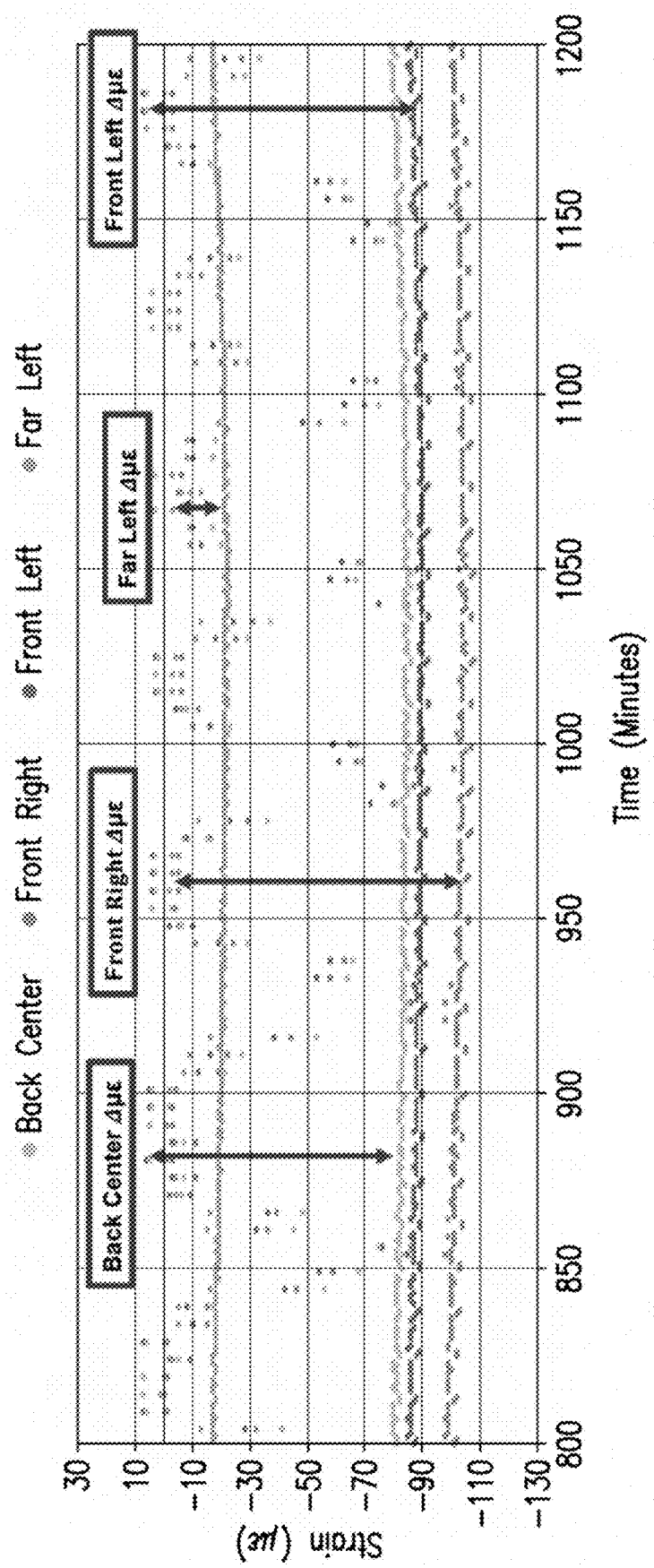
FIG. 22 is a graphical representation showing the impact of temperature on strain data over time for the simulated degraded BSV of FIG. 21 under an applied load.

FIG. 22 shows the graphical representation of micro strain and temperature over time for a simulated BSV having four strain gages positioned in the same manner as the new BSV and with a thermocouple but subject to a load on the door. The degraded BSV under load was similarly differentiated from the degraded BSV without load.

The average strain results for the new and the degraded BSV's are shown below in Table 1 in the various strain gage positions 1-4 described above:

TABLE 1

| Δ Strain (µε) | Front Left | Front Right | Back Center | Far Left |
|---|---|---|---|---|
| New BSV | −79 | −81 | −58 | −30 |
| Degraded BSV | −94 | −99 | −69 | −18 |

The Table demonstrates the correlation between a door that is installed as a new door as against a door wherein the seal has been partially eroded by chemical degradation in a manner similar to that experienced in end applications using such a door. The change in strain, as well as extrapolations of the change in strain, including the slope thereof, that can be translated using the analysis steps herein into a real-time assessed seal health.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:
1. A method for monitoring seal life comprising:
providing a valve assembly movable from an open position to a closed position and comprising a seal having elastomeric properties seated within the valve and in contact with a surface of the valve assembly, wherein when the seal is in operation it is subject to degradation;
placing at least one sensor for measuring micro strain and at least one sensor for measuring at least one other property related to an ambient condition of operation or related to degradation of the seal on a surface of the valve assembly or within the valve assembly;
placing the valve assembly in an operation wherein the seal is subject to degradation and initiating the operation of the valve assembly;
at a time after the operation is initiated, recording micro strain data and data related to the at least one other property;

creating baseline data by initially measuring micro strain and the at least one other property at 100% seal life and measuring micro strain and the at least one other property again at one or more percentages of seal life to create an adjusted range of baseline data; and analyzing the recorded data against baseline data associated with 100% seal life to evaluate seal life at the time after the operation is initiated as a percentage of seal life less than 100%.

2. The method according to claim 1, wherein the valve assembly is one of a valve assembly with a door, a pendulum valve assembly, and an isolation valve assembly.

3. The method according to claim 2, wherein the valve assembly is the valve assembly with a door and the door is configured for covering an opening in a process chamber, and the valve assembly further comprises a valve for operating the door from the open position to the closed position and the seal contacts the door.

4. The method according to claim 3, further comprising placing at least one of the at least one micro strain sensor on an exterior surface of the door.

5. The method according to claim 4, wherein initiating operation of the valve assembly comprises initiating a vacuum process when the door is in the closed position.

6. The method according to claim 5, further comprising evaluating the seal life at the time after the vacuum process is initiated as a percentage of seal life less than 100%.

7. The method according to claim 3, wherein the movable valve door is a bonded slit valve or gate valve.

8. The method according to claim 7, wherein the moveable valve door is a bonded slit valve.

9. The method according to claim 3, wherein the seal is mechanically affixed to a surface of the door.

10. The method according to claim 3, wherein there are two or more sensors for measuring micro strain that are each positioned at different locations on the door.

11. The method according to claim 10, wherein the sensors are bonded to an exterior surface of the door.

12. The method according to claim 10, wherein one or more strain gage rosette pattern is positioned on the door.

13. The method according to claim 12, wherein there are two or more strain gage rosette patterns and they are positioned in different locations.

14. The method according to claim 1, wherein the baseline data is saved and incorporated into a database for predicting seal life for a type of door and seal in a specific process.

15. The method according to claim 1, wherein the at least one sensor is a strain gage.

16. The method according to claim 1, wherein the at least one other property is selected from one or more of temperature, humidity, and vibration, and monitoring of such condition of operation is used to compensate for ambient noise.

17. The method according to claim 1, wherein at least one sensor is placed to measure each of the at least one other property.

18. The method according to claim 1, wherein the strain gage micro strain data is converted to a digital signal through use of a circuit including a Wheatstone bridge to convert micro strain to data to a change in voltage, conditioning an analog signal from the measured change in voltage, and converting the analog signal to the digital signal, wherein the Wheatstone bridge incorporates high precision resistors having a tolerance of no greater than 0.25%.

19. The method according to claim 18, wherein the circuit is incorporated into a printed circuit board.

20. The method according to claim 18, wherein the circuit comprises an amplifier.

21. The method according to claim 1, wherein the baseline data is measured after calibrating the valve assembly.

22. The method according to claim 1, wherein the baseline data is measured after the valve assembly is in operation and the valve is under pressure, based in part on initial micro strain data.

23. The method according to claim 1, wherein the baseline data is measured when a load is applied to the valve and then removed, based at least in part on initial micro strain data.

24. A system for analyzing seal life, comprising:
at least one memory for storing computer-executable instructions; and
at least one processing unit for executing the instructions stored in the memory, wherein execution of the instructions programs the at least one processing unit to perform operations comprising:
engaging a valve assembly movable from an open position to a closed position, to place the valve assembly in operation, wherein the valve assembly comprises a seal having elastomeric properties and the seal is seated within the valve and in contact with a surface of the valve assembly, and wherein pressure is applied to the valve assembly in operation and the seal is subject to degradation;
receiving from a circuit a signal from a change in voltage, wherein the circuit is in communication with at least one sensor for measuring micro strain and with at least one sensor for measuring at least one other property related to an ambient condition of operation or related to degradation of the seal on a surface of the valve assembly or within the valve assembly;
recording micro strain data and data related to the at least one other property at a time after operation of the valve assembly is initiated;
measuring micro strain and the at least one other property at 100% seal life to create baseline data and measuring micro strain and the at least one other property again at one or more percentages of seal life to create an adjusted range of baseline data; and
analyzing the recorded data against the baseline data and/or the adjusted range of baseline data associated with 100% seal life to evaluate seal life at the time after the operation of the valve assembly is initiated as a percentage of seal life less than 100%.

25. The system according to claim 24, wherein the valve assembly is one of a valve assembly with a door, a pendulum valve assembly, and an isolation valve assembly.

26. A method for monitoring seal life comprising:
providing a valve assembly movable from an open position to a closed position and comprising a seal having elastomeric properties seated within the valve and in contact with a surface of the valve assembly, wherein when the seal is in operation it is subject to degradation and wherein the valve is one of a valve assembly with a door, a pendulum valve assembly, and an isolation valve assembly;
placing at least one sensor for measuring micro strain and at least one sensor for measuring at least one other property related to an ambient condition of operation or related to degradation of the seal on a surface of the valve assembly or within the valve assembly;
placing the valve assembly in an operation wherein the seal is subject to degradation and initiating the operation of the valve assembly, wherein initiating the operation of the valve assembly comprises initiating a vacuum process when the valve assembly is in the closed position;

at a time after the operation is initiated, recording micro strain data and data related to the at least one other property;

creating baseline data by initially measuring micro strain and the at least one other property at 100% seal life and measuring micro strain and the at least one other property again at one or more percentages of seal life to create an adjusted range of baseline data; and analyzing the recorded data against baseline data and/or the adjusted range of baseline data associated with 100% seal life to evaluate seal life at the time after the operation is initiated as a percentage of seal life less than 100%.

\* \* \* \* \*